(12) United States Patent
Karnezos

(10) Patent No.: US 6,838,761 B2
(45) Date of Patent: Jan. 4, 2005

(54) SEMICONDUCTOR MULTI-PACKAGE MODULE HAVING WIRE BOND INTERCONNECT BETWEEN STACKED PACKAGES AND HAVING ELECTRICAL SHIELD

(75) Inventor: Marcos Karnezos, Palo Alto, CA (US)

(73) Assignee: ChipPAC, Inc., Fremont, CA (US)

( * ) Notice: Subject to any disclaimer, the term of this patent is extended or adjusted under 35 U.S.C. 154(b) by 25 days.

(21) Appl. No.: 10/632,551

(22) Filed: Aug. 2, 2003

(65) Prior Publication Data

US 2004/0065963 A1 Apr. 8, 2004

Related U.S. Application Data

(60) Provisional application No. 60/411,590, filed on Sep. 17, 2002.

(51) Int. Cl.[7] .......................... H01L 23/02; H01L 23/10; H01L 23/28
(52) U.S. Cl. ........................ 257/685; 257/686; 257/706; 257/659; 257/660; 257/787; 257/778
(58) Field of Search ................................ 257/685, 686, 257/787, 778, 659, 660, 706, 796

(56) References Cited

U.S. PATENT DOCUMENTS

| 5,373,189 A | | 12/1994 | Massit et al. |
| 5,550,711 A | * | 8/1996 | Burns et al. .................. 361/728 |
| 5,898,219 A | * | 4/1999 | Barrow ......................... 257/713 |
| 6,075,289 A | | 6/2000 | Distefano |
| 6,201,302 B1 | * | 3/2001 | Tzu ............................... 257/724 |
| 6,274,930 B1 | | 8/2001 | Vaiyapuri et al. |
| 6,340,846 B1 | | 1/2002 | LoBianco et al. |
| 6,376,904 B1 | | 4/2002 | Haba et al. |
| 6,388,313 B1 | | 5/2002 | Lee et al. |
| 6,400,007 B1 | | 6/2002 | Wu et al. |
| 6,414,381 B1 | | 7/2002 | Takeda |
| 6,424,050 B1 | | 7/2002 | Komiyama |
| 6,489,676 B2 | * | 12/2002 | Taniguchi et al. ........... 257/698 |
| 6,538,319 B2 | * | 3/2003 | Terui ............................ 257/704 |
| 6,737,750 B1 | * | 5/2004 | Hoffman et al. ............. 257/777 |
| 2002/0004258 A1 | | 1/2002 | Nakayama et al. |
| 2002/0014689 A1 | | 2/2002 | Lo et al. |
| 2002/0125557 A1 | | 9/2002 | Chen et al. |
| 2002/0125558 A1 | | 9/2002 | Akram et al. |
| 2002/0130404 A1 | | 9/2002 | Ushijima et al. |

FOREIGN PATENT DOCUMENTS

JP 5-152505 * 6/1993 ................. 257/685

* cited by examiner

Primary Examiner—Jasmine Clark
(74) Attorney, Agent, or Firm—Bill Kennedy; Haynes Beffel & Wolfeld LLP

(57) ABSTRACT

A semiconductor multi-package module having stacked lower and upper packages, each package including a die attached to a substrate, in which the upper and lower substrates are interconnected by wire bonding. Also, a method for making a semiconductor multi-package module, by providing a lower molded package including a lower substrate and a die, affixing an upper molded package including an upper substrate onto the upper surface of the lower package, and forming wire bond z-interconnects between the upper and lower substrates.

30 Claims, 15 Drawing Sheets

SEMICONDUCTOR MULTI-PACKAGE MODULE HAVING WIRE BOND INTERCONNECT BETWEEN STACKED PACKAGES AND HAVING ELECTRICAL SHIELD

CROSS-REFERENCE TO RELATED APPLICATIONS

This application claims the benefit of U.S. Provisional Application No. 60/411,590, filed 17 Sep. 2002, which is hereby incorporated herein by reference.

This application is related to U.S. application Ser. No. 10/632,549, titled "Semiconductor multi-package module having wire bond interconnection between stacked packages"; U.S. application Ser. No. 10/632,568, titled "Semiconductor multi-package module having package stacked over ball grid array package and having wire bond interconnection between stacked packages"; U.S. application Ser. No. 10/632,552, titled "Semiconductor multi-package module having package stacked over die-up flip chip ball grid array package and having wire bond interconnect between stacked packages"; U.S. application Ser. No. 10/632,553, titled "Semiconductor multi-package module having package stacked over die-down flip chip ball grid array package and having wire bond interconnect between stacked packages"; U.S. application Ser. No. 10/632,550, titled "Semiconductor multi-package module including stacked-die packages and having wire bond interconnect between stacked packages". This application and all the said related applications are being filed on the same date, and each of the said related applications is hereby incorporated herein by reference.

BACKGROUND

This invention relates to semiconductor packaging.

Portable electronic products such as mobile phones, mobile computing, and various consumer products require higher semiconductor functionality and performance in a limited footprint and minimal thickness and weight at the lowest cost. This has driven the industry to increase integration on the individual semiconductor chips.

More recently the industry has begun implementing integration on the "z-axis," that is, by stacking chips, and stacks of up to five chips in one package have been used. This provides a dense chip structure having the footprint of a one-chip package, in the range of 5×5 mm to 40×40 mm, and obtaining thicknesses that have been continuously decreasing from 2.3 mm to 0.5 mm. The cost of a stacked die package is only incrementally higher than the cost of a single die package and the assembly yields are high enough to assure a competitive final cost as compared to packaging the die in individual packages.

The primary practical limitation to the number of chips that can be stacked in a stacked die package is the low final test yield of the stacked-die package. It is inevitable that some of the die in the package will be defective to some extent, and therefore the final package test yield will be the product of the individual die test yields, each of which is always less than 100%. This can be particularly a problem even if only two die are stacked in a package but one of them has low yield because of design complexity or technology.

Another limitation is the low power dissipation of the package. The heat is transmitted from one die to the other and there is no significant dissipation path other than through the solder ball to the motherboard.

A further limitation is electromagnetic interference between the stacked die, particularly between RF and digital die, because there is no electrical shielding of either die, Another approach to integrating on the "z-axis" is to stack die packages to form a multi-package module. Stacked packages can provide numerous advantages as compared to stacked-die packages.

For instance, each package with its die can be electrically tested, and rejected unless it shows satisfactory performance, before the packages are stacked. As a result the final stacked multi-package module yields are maximized.

More efficient cooling can be provided in stacked packages, by inserting a heat spreader between the packages in the stack as well as at the top of the module.

Package stacking allows electromagnetic shielding of the RF die and avoids interference with other die in the module.

Each die or more than one die can be packaged in a respective package in the stack using the most efficient first level interconnect technology for the chip type and configuration, such as wire bonding or flip chip, to maximize performance and minimize cost.

The z-interconnect between packages in a stacked multi-package module is a critical technology from the standpoint of manufacturability, design flexibility and cost. Z-interconnects that have been proposed include peripheral solder ball connection, and flexible substrate folded over the top of the bottom package. The use of peripheral solder balls for z-interconnects in stacked multi-package modules limits the number of connections that can be made and limits design flexibility, and results in a thicker and higher cost package. Although the use of a flexible folding substrate provides in principle for design flexibility, there is no established manufacturing infrastructure for the folding process. Moreover, the use of a flexible folding substrate requires a two metal layer flex substrate, and these are expensive. Furthermore the folded flexible substrate approach is restricted to low pincount applications because of limits in routing the circuitry in two metal layer substrates.

The various z-interconnect structures are described in further detail with reference to FIGS. 1–4.

FIG. 1 is a diagrammatic sketch in a sectional view illustrating the structure of a standard Ball Grid Array ("BGA") package, well established in the industry, that can be used as a bottom package in a stacked multi-package module ("MPM"). The BGA, shown generally at 10, includes a die 14 attached onto a substrate 12 having at least one metal layer. Any of various substrate types may be used, including for example: a laminate with 2–6 metal layers, or a build up substrate with 4–8 metal layers, or a flexible polyimide tape with 1–2 metal layers, or a ceramic multi-layer substrate. The substrate 12 shown by way of example in FIG. 1 has two metal layers 121, 123, each patterned to provide appropriate circuitry and connected by way of vias 122. The die is conventionally attached to a surface of the substrate using an adhesive, typically referred to as the die attach epoxy, shown at 13 in FIG. 1 and, in the configuration in FIG. 1, the surface of the substrate onto which the die is attached may be referred to as the "upper" surface, and the metal layer on that surface may be referred to as the "upper" metal layer, although the die attach surface need not have any particular orientation in use.

In the BGA of FIG. 1 the die is wire bonded onto wire bond sites on the upper metal layer of the substrate to establish electrical connections. The die 14 and the wire bonds 16 are encapsulated with a molding compound 17 that provides protection from ambient and from mechanical stress to facilitate handling operations, and provides a surface for marking for identification. Solder balls 18 are reflowed onto bonding pads on the lower metal layer of the substrate to provide interconnection to the motherboard (not shown in the FIGS.) of a final product, such as a computer. Solder masks 125, 127 are patterned over the metal layers 121, 123 to expose the underlying metal at bonding sites for electrical connection, for example the wire bond sites and bonding pads for bonding the wire bonds 16 and solder balls 18.

FIG. 2 is a diagrammatic sketch in a sectional view illustrating the structure of an example of a 2-stack MPM, generally at 20, in which the z-interconnect between the packages in the stack is made by way of solder balls. In this MPM a first package (which may be referred to as the "bottom" package) is similar to a standard BGA as shown in FIG. 1 (and similar reference numerals are employed to point to similar features of the bottom package in FIGS. 1 and 2). A second package (which may be referred to as the "top" package) is stacked on the bottom package and is similar in structure to the bottom package, except that the solder balls in the top package are arranged at the periphery of the top package substrate, so that they effect the z-interconnect without interference with the encapsulation of the bottom BGA. Particularly, the top package in FIG. 2 includes a die 24 attached onto a substrate 22 having at least one metal layer. The top package substrate 22 shown by way of example in FIG. 2 has two metal layers 221, 223, each patterned to provide appropriate circuitry and connected by way of vias 222. The die is conventionally attached to a surface of the substrate (the "upper" surface) using an adhesive, typically referred to as the die attach epoxy, shown at 23 in FIG. 2.

In the top package in the MPM of FIG. 2, as in the bottom package, the die is wire bonded onto wire bond sites on the upper metal layer of the substrate to establish electrical connections. The top package die 24 and wire bonds 26 are encapsulated with a top package molding compound 27. Solder balls 28 are reflowed onto bonding pads located on the peripheral margin of the lower metal layer of the top package substrate to provide z-interconnection to the bottom package. Solder masks 225, 227 are patterned over the metal layers 221, 223 to expose the underlying metal at bonding sites for electrical connection, for example the wire bond sites and bonding pads for bonding the wire bonds 26 and solder balls 28.

The z-interconnection in the MPM of FIG. 2 is achieved by reflowing the solder balls 28 attached to peripheral bonding pads on the lower metal layer of the top package substrate onto peripheral bonding pads on the upper metal layer of the bottom BGA. In this configuration the distance h between the top and bottom packages must be at least as great as the encapsulation height of the bottom package, which may be 0.3 mm or more, and typically is in a range between 0.5 mm and 1.5 mm. The solder balls 28 must accordingly be of a sufficiently large diameter that when they are reflowed they make good contact with the bonding pads of the bottom BGA; that is, the solder ball 28 diameter must be greater than the encapsulation height. A larger ball diameter dictates a larger ball pitch that in turn limits the number of balls that can be fitted in the available space. Furthermore the peripheral arrangement of the solder balls forces the bottom BGA to be significantly larger than the mold cap of a standard BGA. In small BGAs, usually referred to as Chip Scale Packages ("CSP"), the package body size is 1.7 mm larger than the die. In standard BGAs the body size is about 2 mm larger than the mold cap. In this configuration the top package substrate must have at least 2 metal layers to facilitate the electrical connections.

FIG. 3 is a diagrammatic sketch in a sectional view illustrating the structure of an example of a known 2-stack flip chip MPM, shown generally at 30. In this configuration the bottom BGA flip chip package includes a substrate 32 having a patterned metal layer 31 onto which the die 34 is connected by flip chip bumps 36, such as solder bumps, gold stud bumps or anisotropically conducting film or paste. The flip chip bumps are affixed to a patterned array of bump pads on the active surface of the die and, as the active surface of the die faces downward in relation to an upward-facing patterned metal layer of the substrate, such an arrangement may be referred to as a "die down" flip chip package. A polymer underfill 33 between die and substrate provides protection from ambient and adds mechanical integrity to the structure. Such a flip chip package, in which the substrate has a metal layer on only the upper surface, is connected to the underlying circuitry (such as a motherboard, not shown in the FIG.) by solder balls 38 connected to the metal layer through solder vias 35.

The top BGA in this configuration is similar to the bottom BGA, except that the top BGA has z-interconnect solder balls 338 connected (through solder vias 335 in the top substrate) to the metal layer 331 only at the periphery of the top substrate. Solder balls 338 are reflowed onto the metal layer 31 of the bottom substrate to provide the z-interconnect. Particularly, the top BGA in this configuration includes a substrate 332 having a patterned metal layer 331 onto which the top BGA die 334 is connected by flip chip bumps 336. Between the top BGA die and substrate is a polymer underfill 333. A structure as in FIG. 3 is more appropriate for high electrical performance applications, but it has similar limitations to configurations of the type shown in of FIG. 2. It presents an improvement over the FIG. 2 configuration in that the bottom BGA has no molding, allowing for use of smaller diameter (h) solder balls at the periphery of the top BGA for connection between the packages.

FIG. 4 is a diagrammatic sketch in a sectional view illustrating the structure of an example of a known 2-stack folded flexible substrate MPM, shown generally at 40. The bottom package in the configuration of FIG. 4 has a 2-metal layer flexible substrate onto which the die is bonded via small beams to the first metal layer of the substrate. The second metal layer of the bottom package substrate carries the solder balls for connection to the underlying circuitry, such as a motherboard (not shown). The substrate is large enough to be folded over the top of the package, thus bringing the electrical interconnect lines upward where they are available for connection to the top package (an example of which is described below) by way of an array of solder balls on the top package. The space around the die and between the die and folded-over substrate is encapsulated to provide protection and rigidity.

Referring to FIG. 4, the two-metal layer bottom package substrate 42 includes a first metal layer 141 and a second metal layer 143, each patterned to provide appropriate circuitry and connected by way of vias 142. A part of the first metal layer, over a part of the bottom substrate, is processed (for example, using an array of punches) to present an array of cantilever beams or tabs 46 arranged to correspond to an array of interconnect pads on the active surface of the bottom package die 44. Over this part of the substrate 42, which may be referred to as the "die attach part", the first metal layer 141 faces upwardly. The die is aligned, active surface downward, over the die attach part of the substrate, and the cantilevers and the corresponding interconnect pads are joined, typically for example by a "thermosonic" process employing a combination of pressure, heat, and ultrasonic energy to complete the electrical connections. The die 44 is affixed using an adhesive 43, typically a die attach epoxy, onto the die attach part of the flexible substrate 42. A second metal layer 143 of the bottom package substrate 42 faces downwardly in the die attach part of the substrate. Solder balls 48 are reflowed onto bonding pads located on an array on the downward-facing part of the second metal layer 143 to provide for interconnection of the MPM to underlying circuitry (not shown). A solder mask 147 is patterned over the second metal layer 143 to expose the underlying metal as bonding sites for electrical connection, including the bond pads for connection with the underlying circuitry by way of solder balls 48, and the bond pads for connection with the top package by way of solder balls 18, as described below.

Another part of the bottom package substrate 42, extending adjacent the die-attach portion, is folded up and over the bottom package die 44. On this folded-over portion of the flexible substrate 42 the first metal layer 143 faces upwardly. In the configuration of FIG. 4 the top package is generally similar to the BGA of FIG. 1, in which the die is wire bonded onto wire bond sites on the upper metal layer of the substrate to establish electrical connections. Particularly, the top package die 14 is attached onto a substrate 12 having (in this example) two metal layers 121, 123, each patterned to provide appropriate circuitry and connected by way of vias 122. The die is conventionally attached to the upper surface of the top package substrate using an adhesive 13, typically a die attach epoxy. The die 14 and the wire bonds 16 are encapsulated with a molding compound 17 that provides protection from ambient and from mechanical stress to facilitate handling operations, and provides a surface for marking for identification. Solder balls 18 are reflowed onto bonding pads 143 on the upward-facing metal layer of the folded-over bottom package substrate to provide z-interconnection between the top and the bottom packages.

An advantage of a structure as in FIG. 4 is that the folded-over substrate provides sufficient area on the upward-facing surface of the folded-over bottom package substrate to accommodate a full array of solder balls in the top package and to accommodate more complex interconnect between the two packages. It also provides for a small package footprint. A primary disadvantage of this configuration is the high cost of the substrate and the unavailability of folding technology and equipment.

A common feature of all these stacked package configurations is that they enable pretesting of each package, and provide for production MPMs with higher final test yields.

SUMMARY

This invention is directed to multi-package modules having stacked packages. According to the invention, z-interconnection between the stacked packages in the MPM is wire bond based. Generally, the invention features various configurations of various stacked packages, and methods for stacking and interconnecting the various packages by wire-bonding based z-interconnection. In the multi-package module according to the invention the package stack can include any of a variety of BGA packages and/or any of a variety of Land Grid Array ("LGA") packages; the package stack can include wire bonded and/or flip chip packages; the package stack can include a thermal enhancement feature enabled by one or more heat spreaders in or on the stack; the package stack can include one or more packages having a flip chip die bonded either to the top or to the bottom of the BGA or LGA; the package stack can include one or more BGA and/or LGA packages having more than one die in the package stacked or side by side; the stack can include electromagnetic shield for one or more of the packages; and the stack can include any substrate, laminate or build-up or flexible or ceramic, provided that the z-interconnect pads are made available for bonding on the periphery of the packages.

In one general aspect the invention features a multi-package module having stacked lower and upper packages, each package including a die attached to a substrate, in which the upper and lower substrates are interconnected by wire bonding.

The invention provides for excellent manufacturability, high design flexibility, and low cost to produce a stacked package module having a low profile and a small footprint. The wire bond z-interconnect is well established in the industry; it is the lowest cost interconnect technique and it is directly applicable, without significant modification, to the stacked multi-package modules of the invention. It provides design flexibility to the relative size of the BGA to LGA that can be bridged by wire length. Using available techniques and equipment the wire in a wire bond can be as short as 0.5 mm or as long as 5 mm. The arrangement of the z-interconnect pads can be implemented through either or both BGA and LGA substrate designs. Moreover, using wire bonds according to the invention z-interconnect can be formed between pads that are not precisely aligned over one another, by employing so-called "out of sequence bonding" that is in current use in the industry. The wire bonding pitch is the finest available technology in the industry at 50 microns currently, and projected to go to 25 microns. This enables a high number of z-interconnects. Both manufacturability and design flexibility contribute to the low cost of the MPM.

A minimum footprint for a typical BGA or LGA is 1.7 mm larger than the die size. The addition of the z-interconnect bond pads according to the invention will increase the BGA size minimally, by 0.8 mm. A typical BGA thickness is 1.0 mm and LGA thickness is 0.8 mm. A typical adhesive thickness can be in the range 0.025 mm to 0.100 mm. Both the footprint and the thickness of the stacked package MPM according to the invention fall within accepted ranges for most applications.

In some embodiments the multi-package module includes three or more packages, affixed serially to form a stack.

In another aspect the invention features a multi-package module having stacked first ("bottom") and second ("top") packages, each package including a die attached to a substrate and connected to the substrate by wire bonding, in which the top package substrate and the bottom package substrate are interconnected by wire bonding. In some embodiments each package is fully encapsulated with a molding material; in other embodiments at least one of the packages is encapsulated only to an extent sufficient to protect the wire bonds between the die and the substrate during subsequent handling and testing. In some embodiments the second package is an LGA package, and in some such embodiments the LGA package substrate is a single-metal layer substrate.

In another aspect the invention features a multi-package module having stacked first ("bottom") and second ("top") packages, the bottom package being a BGA package, each package including a die attached to a substrate, in which the top package substrate and the BGA package substrate are interconnected by wire bonding.

In another aspect the invention features a multi-package module having stacked packages in which at least one package is provided with an electrical shield. In some such configurations the electrical shield may additionally be configured to serve as a heat spreader. In some embodiments the package that is provided with an electrical shield includes an RF die, and the shield serves to limit electromagnetic interference between the RF die and other die in the multi-package module. In some embodiments the bottom package is provided with an electrical shield.

In another aspect the invention features a multi-package module having stacked first ("bottom") and second ("top") packages, the bottom package being a flip-chip BGA package having a flip-chip in a die-up configuration, in which the top substrate and the bottom package are interconnected by wire bonding. In some embodiments the top package is a stacked die package; in some embodiments the adjacent stacked die in the stacked die package can be separated by spacers. In some embodiments the flip-chip die on the bottom package is provided with an electrical shield. In some embodiments the bottom package substrate includes an embedded ground plane, the ground plane being configured to serve also for heat dissipation and as an electrical shield.

In another aspect the invention features a multi-package module having stacked first ("bottom") and second ("top") packages, the bottom package being a flip-chip BGA package having a flip-chip in a die-down configuration, in which the top substrate and the bottom package are interconnected by wire bonding. In some embodiments the flip-chip die on the bottom package is provided with an electrical shield:

Also the invention features methods for making multi-package modules having stacked packages interconnected by wire bonding, by providing a first (bottom) package including at least one die on a first (bottom) package substrate, placing over the first package a second (top) package including at least one die on a second (top) package substrate, and forming wire bond z-interconnects between the first and second (top and bottom) substrates. Advantageously, the packages can be tested prior to assembly, and packages not meeting requirements for performance or reliability can be discarded, so that preferably only first packages and second packages tested as "good" are used in the assembled module.

In some applications a module having improved performance can be made by providing one of the packages, and particularly for example a high frequency processor package, with an electromagnetic shield.

Accordingly, in another general aspect the invention features a method for making a multi-package module including a top package stacked over a ball grid array bottom package, in which the top and bottom packages are electrically interconnected by wire bonding, and in which the bottom package is provided with an electromagnetic shield. According to this aspect, a ball grid array package is provided, usually in an unsingulated strip of BGA packages; the BGA packages are provided with shields affixed over the die; preferably the BGA packages in the strip are tested for performance and reliability and packages identified as "good" are subjected to subsequent treatment; adhesive is dispensed over the upper surface of the shields on "good" BGA packages; a singulated molded land grid array package is provided; preferably the LGA package is tested and identified as "good"; the "good" LGA package is placed onto the adhesive over the shield, and the adhesive is cured; optionally and preferably a plasma clean operation is performed followed by formation of wire bond z-interconnections between the stacked top LGA and bottom BGA package; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In some embodiments the method includes steps for providing the multi-package module with a heat spreader. In this aspect of the invention a similar process is performed, with additional steps interposed installation of supported heat spreader by a "drop-in" mold operation, or for installation of a simple planar heat spreader by a drop-in mold operation; or by applying adhesive onto an upper surface of the top package molding or onto an upper surface of a spacer upon the top package, and affixing the planar heat spreader onto the adhesive.

In another aspect the invention features a method for making a multi-package module including a top package stacked over a die-down flip chip BGA bottom package, in which the top and bottom packages are electrically interconnected by wire bonding. According to this aspect, a die-down flip chip BGA bottom package, optionally molded, is provided, usually in unsingulated strip of die-down flip chip ball grid array bottom packages; preferably the BGA packages in the strip are tested for performance and reliability and packages identified as "good" are subjected to subsequent treatment; adhesive is dispensed onto the upper surface (back side) of the die on "good" BGA packages; singulated top (e.g., land grid array) packages, optionally molded, are provided; preferably the LGA package is tested and identified as "good"; the "good" LGA package is placed onto the adhesive over the shield, and the adhesive is cured; optionally and preferably a plasma clean operation is performed followed by formation of wire bond z-interconnections between the stacked top LGA and bottom BGA package; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In another aspect the invention features a method for making a multi-package module including a top package stacked over a die-down flip chip BGA bottom package, in which the top and bottom packages are electrically interconnected by wire bonding, and in which the bottom package is provided with an electrical shield. According to this aspect, a process is performed similar to that described above for the unshielded bottom flip chip bottom package, with an additional step interposed for installation of the shield over the bottom package flip chip die. A die-down flip chip BGA bottom package, optionally molded, is provided, usually in unsingulated strip of die-down flip chip ball grid array bottom packages; preferably the BGA packages in the strip are tested for performance and reliability and packages identified as "good" are subjected to subsequent treatment; an electrical shield is affixed over the die on "good" bottom BGA packages; adhesive is dispensed onto the upper surface of the shield on "good" BGA packages; singulated top (e.g., land grid array) packages, optionally molded, are provided; preferably the LGA package is tested and identified as "good"; the "good" LGA package is placed onto the adhesive over the shield, and the adhesive is cured; optionally and preferably a plasma clean operation is performed followed by formation of wire bond z-interconnections between the stacked top LGA and bottom BGA package; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In another aspect the invention features a method for making a multi-package module including a top package stacked over a die-up flip chip BGA bottom package, in which the top and bottom packages are electrically interconnected by wire bonding. According to this aspect, a die-up flip chip ball grid array package, usually not molded, is provided, usually as an unsingulated strip of die-up flip chip ball grid array packages; preferably the BGA packages in the strip are tested for performance and reliability and packages identified as "good" are subjected to subsequent treatment; adhesive is dispensed over the upper surface of the substrate on "good" BGA packages; a second package is provided, which may in some embodiments be a stacked die package, optionally and usually molded; preferably the LGA package is tested and identified as "good"; the "good" LGA package is placed onto the adhesive over the BGA substrate, and the adhesive is cured; optionally and preferably a plasma clean operation is performed followed by formation of wire bond z-interconnections between the stacked top LGA and bottom BGA package; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In some embodiments of the method two or more first molded packages are provided in an unsingulated strip, and assembly of the two or more modules proceeds on the strip, and singulation of the two or more modules is carried out after assembly has been completed.

In methods according to the invention for making multi-package modules the electrical connections between the stacked packages employs conventional wire bonding to form the z-interconnect between upper and lower package substrates in the stack. Particular advantages include the use of established manufacturing infrastructure, low production cost, design flexibility, and a thin package product. The z-interconnect wire bonding can be carried out, in the various package and module configurations, by drawing the wire to a conductive pad on the first package substrate from a bump formed on a conductive pad on the second package substrate; or, by drawing the wire to a conductive pad on the second package substrate from a bump formed on a conductive pad on the first package substrate.

The invention provides for assembly of more than one semiconductor in a thin and minimal footprint package at the lowest cost and highest final test yield. Furthermore some stack configurations according to the invention allow for high thermal performance, high electrical performance or electrical isolation of an RF component from a digital one. Other stack configurations provide a very thin structure appropriate for handheld or consumer products. All provide for a method for assembly that allows individual testing of the stacked packages to maximize the final yield of the module.

Additional process steps will be employed to complete the multi-package module according to the invention. For example, it may be preferred not to attach solder balls for connection of the lowermost package in the stack to the motherboard until the final step before singulation of the MPMs. And, for example, a plasma clean may be performed at any of a variety of points in the process, such as following adhesive cure and prior to encapsulation, and such as prior to and/or following z-interconnect wire bonding.

Advantageously, the individual packages can be provided as strips of several packages, connected in a row for ease of handling during manufacture, and the multi-package modules are singulated following completion of process steps. In methods according to the invention, the package stacks can be formed on a strip of nonsingulated first packages of a selected type by affixing singulated second packages and forming the wire bonded z-interconnects until the process of forming the modules is complete, and then singulating the modules.

MPM according to the invention can be used for building computers, telecommunications equipment, and consumer and industrial electronics devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 5A:
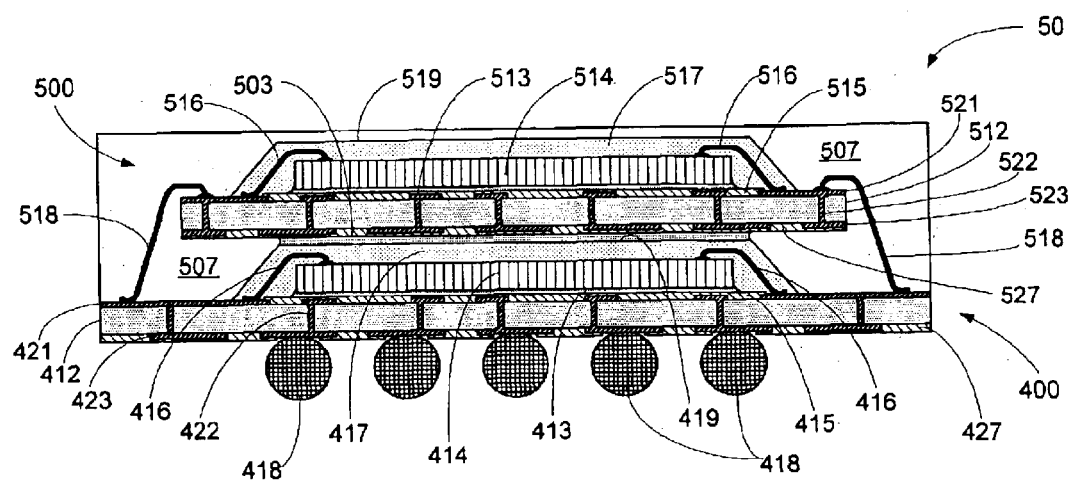
FIG. 5A is a diagrammatic sketch in a sectional view thru an embodiment of a multi-package module having wire bond z-interconnection between stacked BGA and LGA semiconductor packages according to an aspect of the invention.

Turning now to FIG. 5A, there is shown in a diagrammatic sectional view generally at 50 an embodiment of a multi-package module according to an aspect of the invention, including stacked first ("bottom") and second ("top") packages, in which the stacked packages are interconnected by wire bonding. In the embodiment shown in FIG. 5A, the bottom package 400 is a conventional BGA package such as that shown in FIG. 1. Accordingly, in this embodiment the bottom package 400 includes a die 414 attached onto a bottom package substrate 412 having at least one metal layer. Any of various substrate types may be used, including for example: a laminate with 2–6 metal layers, or a build up substrate with 4–8 metal layers, or a flexible polyimide tape with 1–2 metal layers, or a ceramic multi-layer substrate. The bottom package substrate 412 shown by way of example in FIG. 5A has two metal layers 421, 423, each patterned to provide appropriate circuitry and connected by way of vias 422. The die is conventionally attached to a surface of the substrate using an adhesive, typically referred to as the die attach epoxy, shown at 413 in FIG. 5A and, in the configuration in FIG. 5A, the surface of the substrate onto which the die is attached may be referred to as the "upper" surface, and the metal layer on that surface may be referred to as the "upper" metal layer, although the die attach surface need not have any particular orientation in use.

In the bottom BGA package of FIG. 5A the die is wire bonded onto wire bond sites on the upper metal layer of the substrate to establish electrical connections. The die 414 and the wire bonds 416 are encapsulated with a molding compound 417 that provides protection from ambient and from mechanical stress to facilitate handling operations, and provides a bottom package upper surface 419 onto which a second ("top") package can be stacked. Solder balls 418 are reflowed onto bonding pads on the lower metal layer of the substrate to provide interconnection to underlying circuitry of, for example, a motherboard (not shown in the FIGS.) of a final product, such as a computer. Solder masks 415, 427 are patterned over the metal layers 421, 423 to expose the underlying metal at bonding sites for electrical connection, for example the wire bond sites and bonding pads for bonding the wire bonds 416 and solder balls 418.

Figure 1:
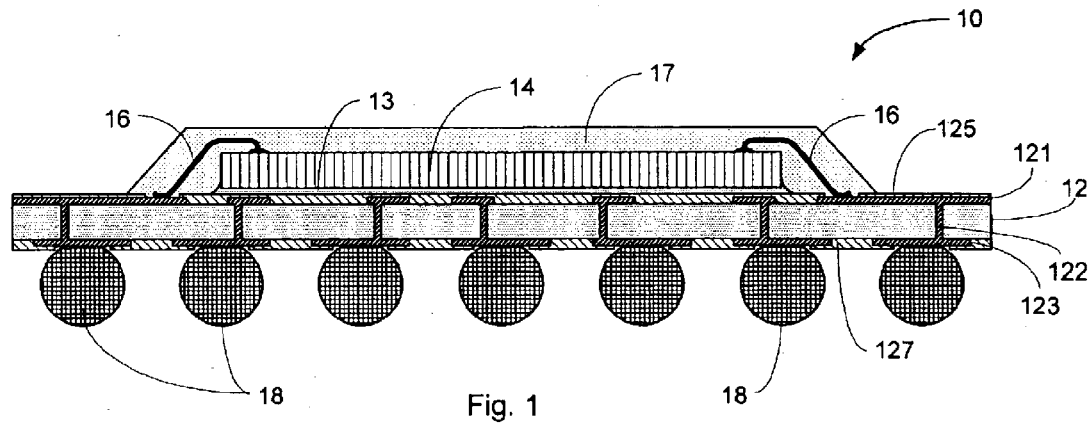
FIG. 1 is a diagrammatic sketch in a sectional view thru a conventional ball grid array semiconductor package.
Figure 2:
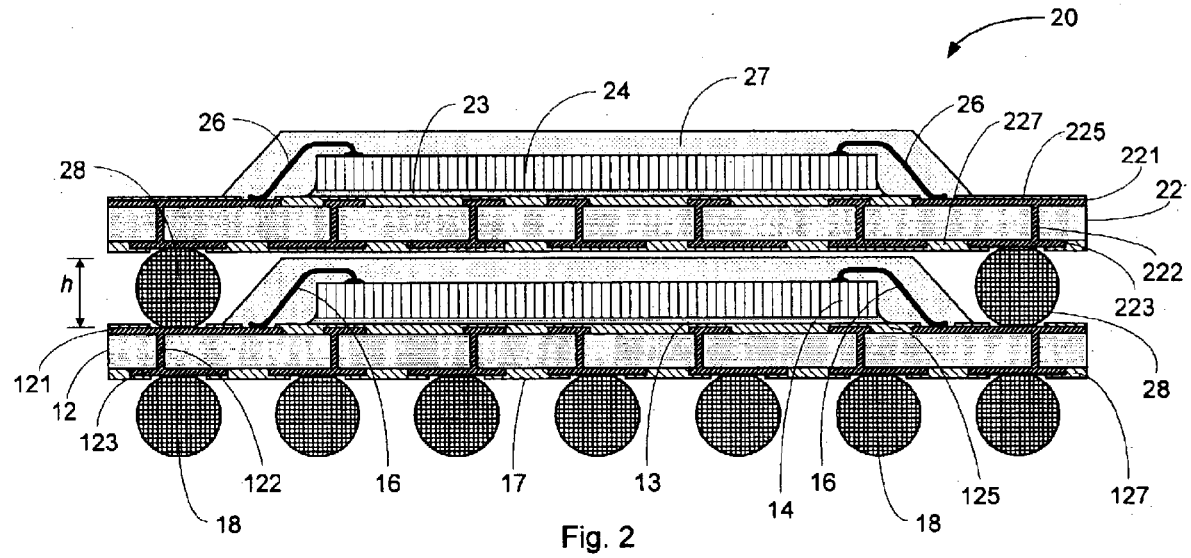
FIG. 2 is a diagrammatic sketch in a sectional view thru a conventional multi-package module having solder ball z-interconnection between stacked ball grid array semiconductor packages.
Figure 3:
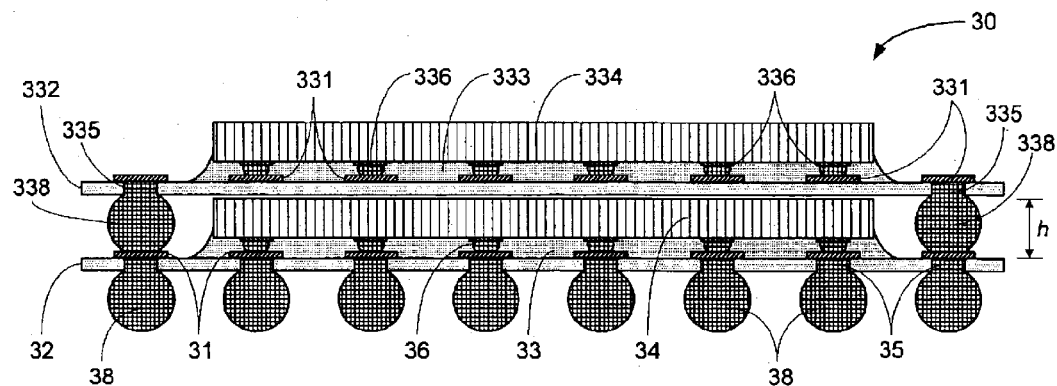
FIG. 3 is a diagrammatic sketch in a sectional view thru a conventional flip chip multi-package module having solder ball z-interconnection between stacked flip chip semiconductor packages.
Figure 4:
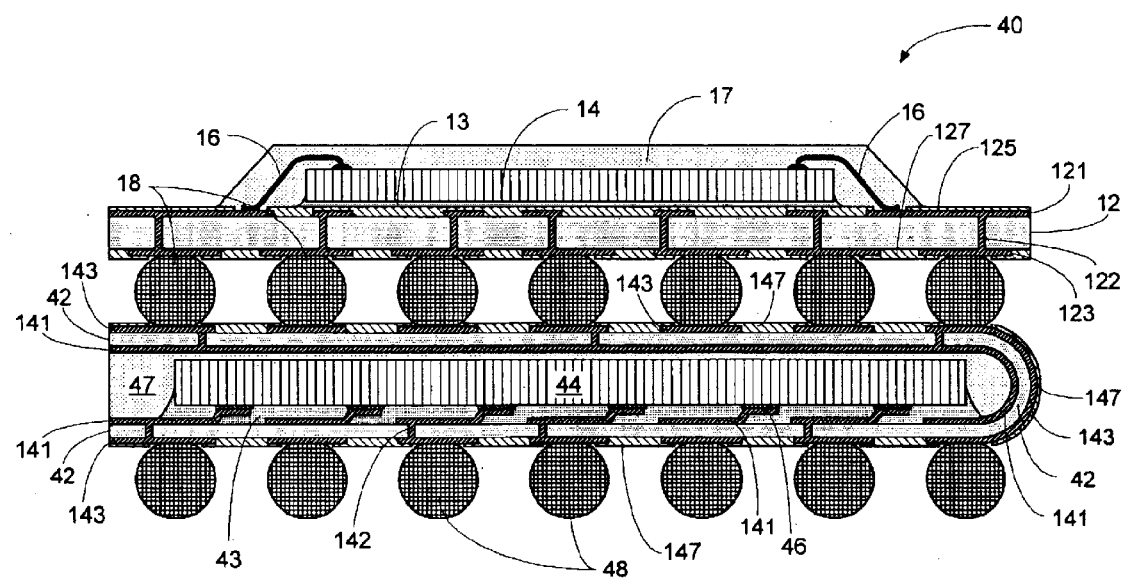
FIG. 4 is a diagrammatic sketch in a sectional view thru a conventional multi-package module having a folded flexible substrate and solder ball z-interconnection between stacked semiconductor packages.

In the embodiment shown in FIG. 5A, the top package 500 is a land grid array ("LGA") package, which may be similar to a BGA package, as shown for example in FIG. 1, but having no solder balls mounted on bonding pads of the lower surface of the substrate. Particularly, in this example, the top package 500 includes a die 514 attached onto a top package substrate 512 having at least one metal layer. Any of various substrate types may be used; the top package substrate 512 shown by way of example in FIG. 5A has two metal layers 521, 523, each patterned to provide appropriate circuitry and connected by way of vias 522. The die is conventionally attached to a surface of the substrate using an adhesive, typically referred to as the die attach epoxy, shown at 513 in FIG. 5A and, in the configuration in FIG. 5A, the surface of the substrate onto which the die is attached may be referred to as the "upper" surface, and the metal layer on that surface may be referred to as the "upper" or "top" metal layer, although the die attach surface need not have any particular orientation in use.

In the top LGA package in the embodiment of FIG. 5A the die is wire bonded onto wire bond sites on the upper metal layer of the substrate to establish electrical connections. The die 514 and the wire bonds 516 are encapsulated with a molding compound 517 that provides protection from ambient and from mechanical stress to facilitate handling operations, and has a top package upper surface 519. The top package 500 is stacked over the bottom package 400 and affixed there using an adhesive 513. Solder masks 515, 527 are patterned over the metal layers 521, 523 to expose the underlying metal at bonding sites for electrical connection, for example the wire bond sites for bonding the wire bonds 516.

The z-interconnect between the stacked top package 500 and bottom package 400 is made by way of wire bonds 518 connecting the top metal layers of the respective package substrates. At one end each wire bond 518 is electrically connected to upper surfaces of pads on the upper metal layer 521 of the top package substrate 512, and at the other end each wire bond is connected to the upper surfaces of pads on the upper metal layer 421 of the bottom package substrate 412. The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 5A as having been made by forming a bead or bump on the upper surface of a pad on the upper metal layer of the top substrate, and then drawing the wire downward toward and fusing it onto, a pad on the upper metal layer of the bottom substrate. As will be appreciated, the wire bonds can be made in the inverse direction, that is, by forming a bead or bump on the upper surface of a pad on the upper metal layer of the bottom substrate, and then drawing the wire upward toward and fusing it onto, a pad on the upper metal layer of the top substrate. As will be appreciated, selection of a wire bonding strategy for the package-to-package z-interconnection will be determined according to the geometric arrangements of the margins of the stacked substrates and of the bonding surfaces on them.

In the stacked package embodiment of FIG. 5A, the z-interconnect pads on the respective package substrates are arranged on the upper metal layers near the margins of the package substrates. The location and order of the z-interconnect pads are generally arranged so that the z-interconnect pads on the top package substrate approximately overlie the corresponding z-interconnect pads on the bottom package when the packages are stacked. Conveniently, the top package 500 has a smaller substrate footprint than that of the bottom package 400, to allow clearance for the wire bonds without electrical shorting to the edges of the metal layers of the substrates. Once the z-interconnect wire bonds have been formed, a module encapsulation is formed, to enclose and protect the z-interconnect wire bonds and to provide mechanical integrity to the completed module.

Figure 5D:
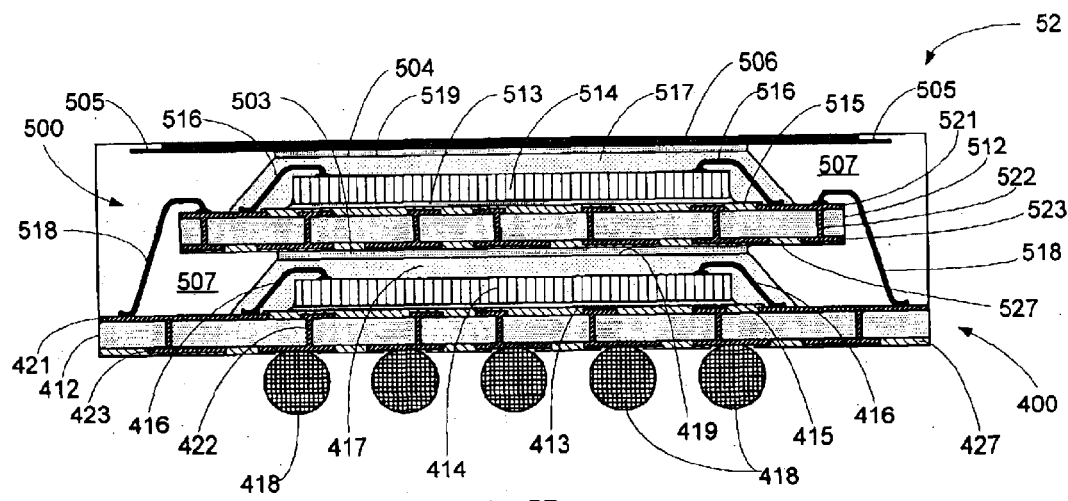
FIG. 5D is a diagrammatic sketch in a sectional view thru an embodiment of a multi-package module having wire bond z-interconnection between stacked BGA and LGA semiconductor packages according to an aspect of the invention, and having a heat spreader affixed to an upper surface of the top package.
Figure 5E:
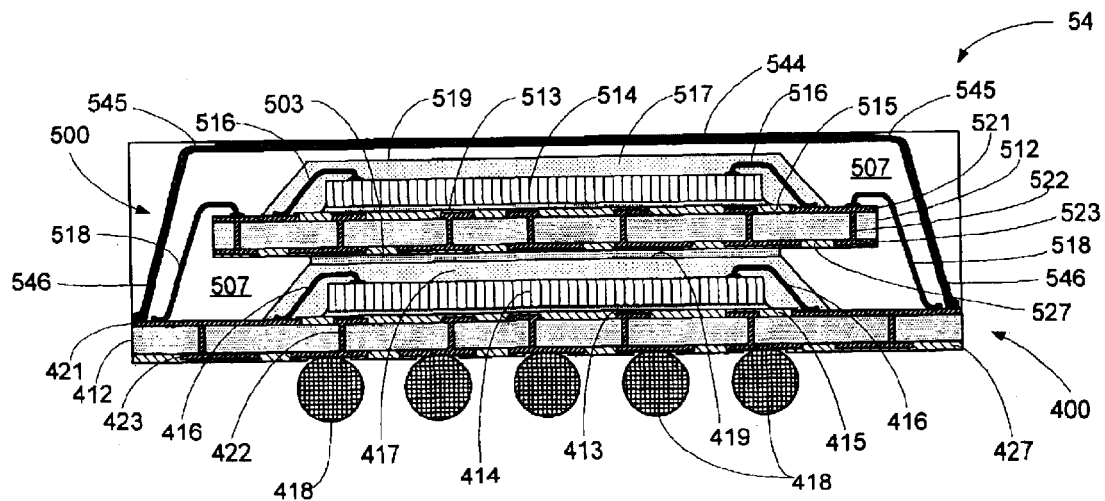
FIG. 5E is a diagrammatic sketch in a sectional view thru an embodiment of a multi-package module having wire bond z-interconnection between stacked BGA and LGA semiconductor packages, and having a heat spreader according to another aspect of the invention.
Figure 5B:
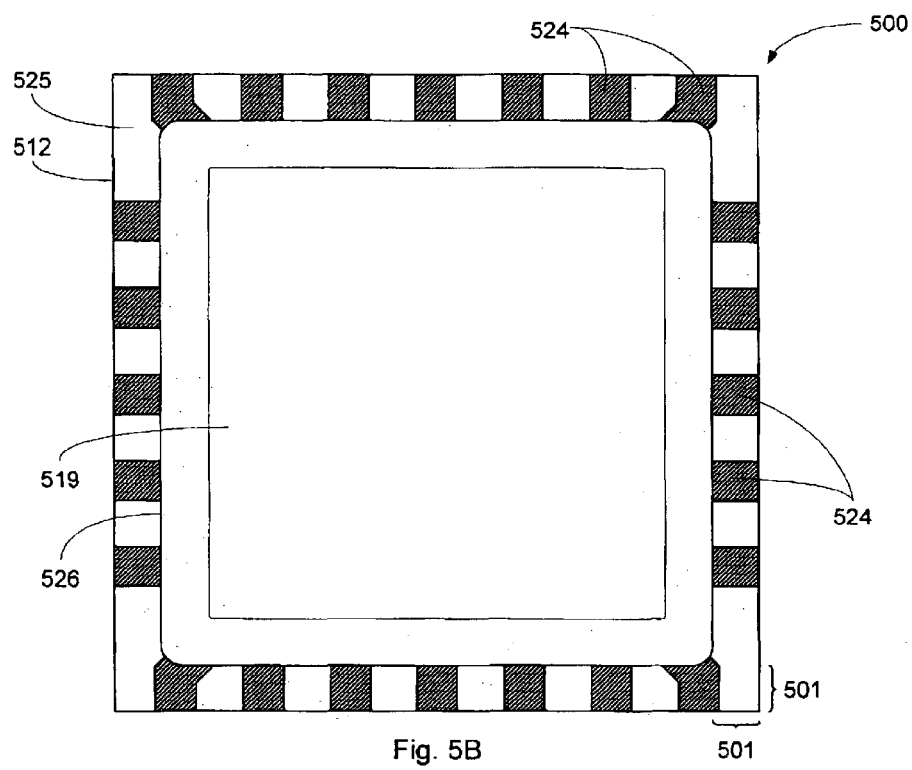
FIG. 5B is a diagrammatic sketch in a plan view showing a bottom BGA substrate having z-interconnect bond pads in an arrangement suitable for use in an embodiment of the invention as shown in FIG. 5A.
Figure 5C:
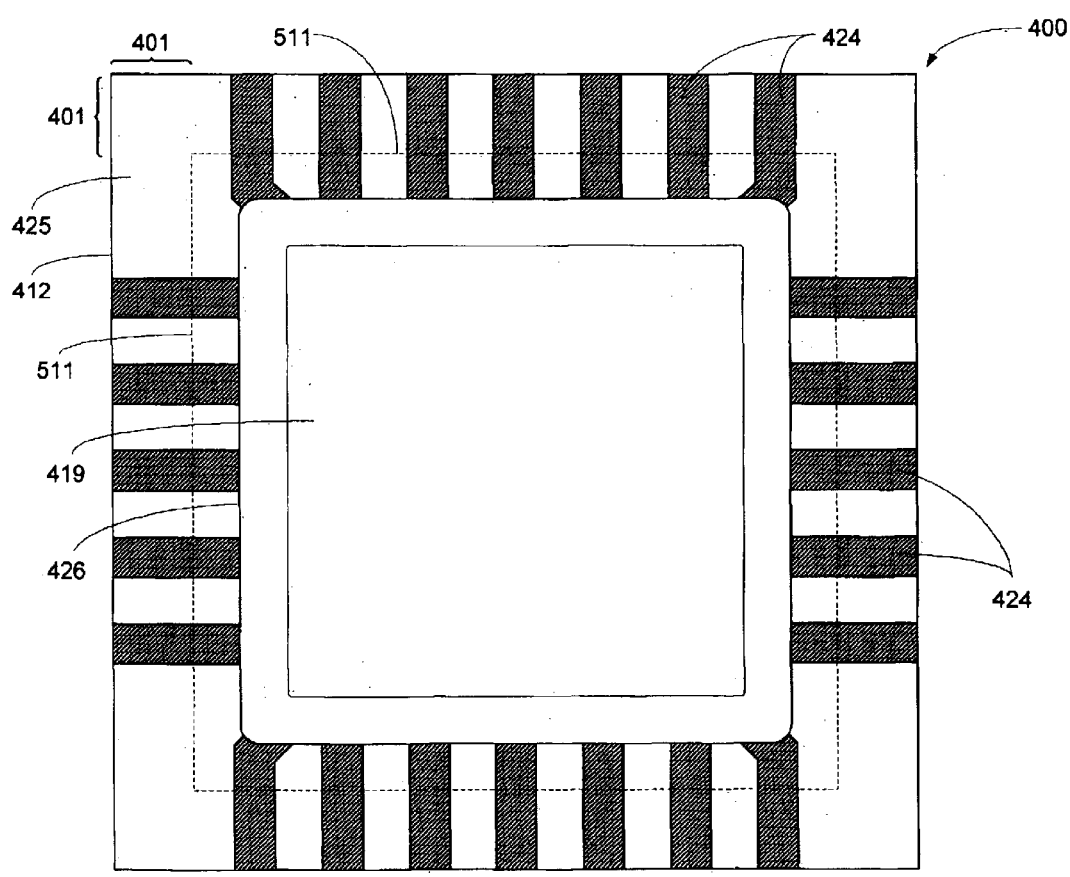
FIG. 5C is a diagrammatic sketch in a plan view showing a top LGA substrate having z-interconnect bond pads in an arrangement suitable for use in an embodiment of the invention as shown in FIG. 5A.

The arrangements of the z-interconnect pads on the top and bottom package substrates are shown by way of example in diagrammatic plan view in FIGS. 5B and 5C, generally at 500 and 400, respectively. Referring to FIG. 5B, top package z-interconnect pads 524 are formed by patterning regions of the upper metal layer situated at the margin 501 on the upper surface 525 of the top package substrate 512. The margin 501 extends beyond the edge 526 of the top package encapsulant material, which has an upper surface 519. Referring now to FIG. 5C, bottom package z-interconnect pads 424 are formed by patterning regions of the upper metal layer situated at the margin 401 on the upper surface 425 of the top package substrate 412. The margin 401 extends beyond the footprint 511 of the stacked and overlying top package substrate 512, and further beyond the edge 426 of the bottom package encapsulant material, which has an upper surface 419.

As will be apparent from FIGS. 5A, 5B and 5C, z-interconnection between the top and bottom packages according to the invention is made by wire bond between (either bond-up or bond-down) the top package interconnect pads 524 in the margin 501 of the top package substrate and the bottom package interconnect pads 424 in the margin 401 of the bottom package substrate. The multipackage module structure is protected by formation of a module encapsulant 507, and solder balls 418 are reflowed onto exposed solder ball pads on the lower metal layer of the bottom package substrate, for connection to underlying circuitry, such as a motherboard (not shown in the FIGS.).

As will be appreciated from the foregoing, the structure according to the invention allows for pre-testing of both the BGA and LGA before assembly into the multi-package module, to permit rejection of nonconforming packages prior to assembly, and thereby to assure high final module test yields.

For improved heat dissipation from the multi-package module, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper), and it may be affixed to the MPM encapsulant during the molding material curing process. Or, the heatspreader may have a generally planar portion over the top package, and a peripheral supporting portion or supporting members resting on or near the upper surface of the bottom package substrate.

By way of example, FIG. 5E is a diagrammatic sketch in a sectional view showing a stacked BGA+LGA MPM 54 according to another aspect of the invention, in which a "top" heat spreader is provided at the upper surface of the MPM. The construction of the stacked packages in MPM 54 is generally similar to that of MPM 50 in FIG. 5A, and like structures are identified in the FIGS. by like reference numerals. The top heat spreader in this example is formed of a thermally conductive material having a generally planar central portion 544 situated over the top package, and peripheral supporting members 546 extending to the upper surface of the bottom package substrate 412. The upper surface of the planar portion 544 is exposed to ambient at the MPM upper surface for efficient heat exchange away from the MPM. The top heat spreader may be formed, for example, of a sheet of metal (such as copper), for example by stamping. The supporting members 546 can optionally be affixed to the upper surface of the bottom package substrate using an adhesive (not show in the FIGS.). The multi-package module structure is protected by formation of a module encapsulant 507, and the heat spreader supporting members are embedded in the MPM encapsulant 507 during the molding material curing process. In the embodiment of FIG. 5E a step like re-entrant feature 545 is provided on the periphery of the planar upper portion 544 of the heat spreader to allow for better mechanical integrity of the structure with less delamination from the molding compound. In this embodiment the space between the lower surface of the heat spreader 544 and the upper surface 519 of the LGA molding 917 is filled by a thin layer of the MPM molding.

Alternatively, a top heat spreader can be affixed to the upper surface of the LGA molding as shown diagrammatically in a sectional view in FIG. 5D. The construction of the stacked packages in MPM 52 is generally similar to that of MPM 50 in FIG. 5A, and like structures are identified in the FIGS. by like reference numerals. The top heat spreader 504 in the example of FIG. 5D is a generally planar piece of a thermally conductive material having at least the more central area of its upper surface exposed to ambient for efficient heat exchange away from the MPM, as in the example of FIG. 5E. The top heat spreader may be, for example, a sheet of metal (such as copper). Here, however, the top heat spreader 504 is affixed onto the upper surface 519 of the upper package encapsulant 517 using an adhesive 506. The adhesive 506 may be a thermally conductive adhesive, to provide improved heat dissipation. Usually the top heat spreader is affixed to the top package molding after the top package molding has been at least partly cured, but before the molding material is injected for the MPM encapsulation 507. The periphery of the top heat spreader may be encapsulated with the MPM molding material. In the embodiment of FIG. 5D a step like re-entrant feature 505 is provided on the periphery of the heat spreader 504 to allow for better mechanical integrity of the structure with less delamination from the molding compound.

As a further alternative, an MPM as in FIG. 5A can be provided with a simple planar heat spreader, with no supporting members, that is not attached to the upper surface of the top package molding. In such embodiments, as in the embodiment of FIG. 5D, the top heat spreader can be a generally planar piece of a thermally conductive material such as, for example, a sheet of metal (such as copper), and at least the more central area of the upper surface of the planar heat spreader is exposed to ambient for efficient heat exchange away from the MPM. Here, the space between the lower surface of the simple planar heat spreader and the upper surface 519 of the LGA molding 517 may be filled by a thin layer of the MPM molding, and such a simple planar heat spreader may be affixed to the MPM encapsulant 507 during the molding material curing process. The periphery of such an unattached simple planar top heat spreader can be encapsulated with the MPM molding material, as in the attached planar heat spreader of FIG. 5D, and may be provided with a step-like re-entrant feature 505 on the periphery to allow for better mechanical integrity of the structure with less delamination from the molding compound.

An MPM structure having a heat spreader, as in FIGS. 5D, 5E, can provide improved thermal performance.

Figure 6A:
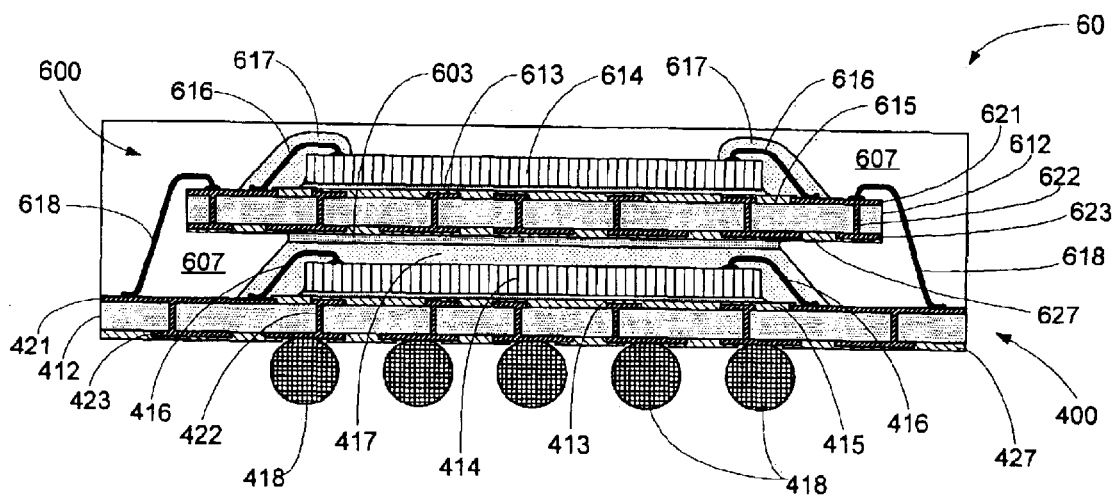
FIG. 6A is a diagrammatic sketch in a sectional view thru another embodiment of a multi-package module having wire bond z-interconnection between stacked BGA and LGA semiconductor packages according to an aspect of the invention, in which the top package is provided with peripheral molding.

Referring now to FIG. 6A there is shown a diagrammatic sketch in a sectional view showing a stacked package multi-package module according to an aspect of the invention, having an LGA top package stacked over a BGA bottom package, in which the top package LGA is partially encapsulated. That is, the molding material for the top LGA package is applied in limited regions and in limited amounts, sufficient to protect the wire bonds during subsequent handling, particularly during subsequent performance testing. In other respects the configuration of FIG. 6A is substantially as shown in FIG. 5A. Accordingly, in this embodiment the bottom package 400 is constructed as described with reference to FIG. 5A, and the top package 600 is constructed substantially as described with reference to FIG. 5A, except for the difference in the top package encapsulation. Particularly, the top package 600 includes a die 614 attached onto a top package substrate 612 having at least one metal layer. Any of various substrate types may be used; the top package substrate 512 shown by way of example in FIG. 6A has two metal layers 621, 623, each patterned to provide appropriate circuitry and connected by way of vias 622. The die is conventionally attached to a surface of the substrate using an adhesive, typically referred to as the die attach epoxy, shown at 613 in FIG. 6A and, in the configuration in FIG. 6A, the surface of the substrate onto which the die is attached may be referred to as the "upper" surface, and the metal layer on that surface may be referred to as the "upper" or "top" metal layer, although the die attach surface need not have any particular orientation in use.

In the top LGA package in the embodiment of FIG. 6A the die is wire bonded onto wire bond sites on the upper metal layer of the substrate to establish electrical connections. The die 614 and the wire bonds 616 are encapsulated with a molding compound 617 that provides protection from ambient and from mechanical stress to facilitate handling operations. The encapsulant 617 in this embodiment is formed such as to envelop the wire bonds and their respective connections to the top package substrate and the top package die only, so that much of the upper surface of the die 614 is not covered by the encapsulant. The top package 600 is stacked over the bottom package 400 and affixed there using an adhesive. Solder masks 615, 627 are patterned over the metal layers 621, 623 to expose the underlying metal at bonding sites for electrical connection, for example the wire bond sites for bonding the wire bonds 616.

The z-interconnect between the stacked top package 600 and bottom package 400 is made by way of wire bonds 618 connecting the top metal layers of the respective package substrates. The multipackage module structure is protected by formation of a module encapsulant 607, and solder balls 418 are reflowed onto exposed solder ball pads on the lower metal layer of the bottom package substrate, for connection to underlying circuitry, such as a motherboard (not shown in the FIGS.).

An advantage of this configuration is reduced cost. The partial encapsulation is implemented in line with the wire bonding process (for example by dispensation through a fine nozzle, as from a syringe through a hollow needle) and therefore provides a higher throughput and uses less encapsulant material. Subsequent to the partial encapsulation the top LGA package can be tested without resort to special handling to avoid damaging the top package wire bonds.

For improved heat dissipation from the multi-package module as shown for example in FIG. 6A, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper), and it may be affixed to the MPM encapsulant during the molding material curing process. Or, the heatspreader may have a generally planar portion over the top package, and a peripheral supporting portion or supporting members resting on or near the upper surface of the bottom package substrate.

Figure 6B:
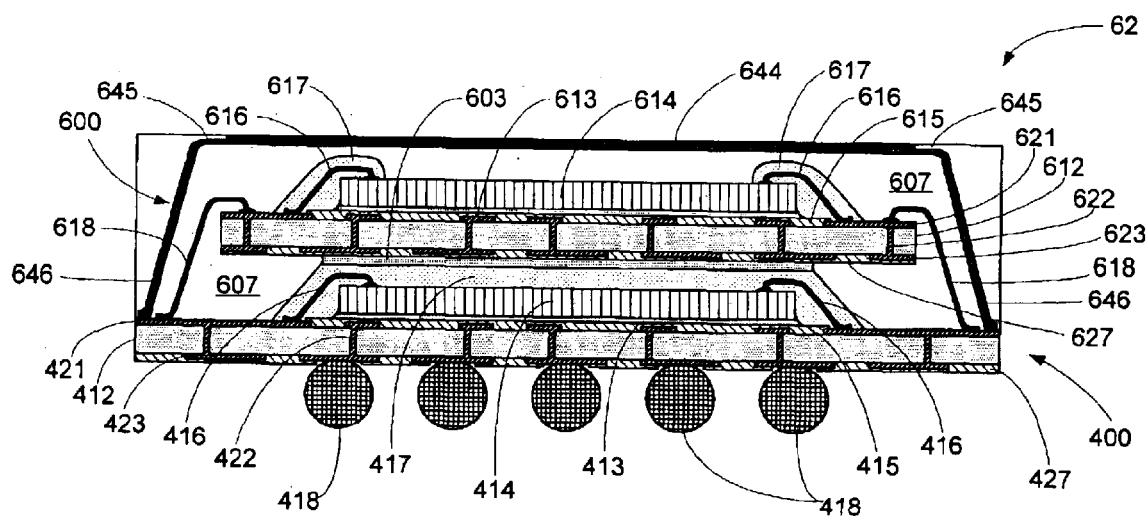
FIG. 6B is a diagrammatic sketch in a sectional view thru another embodiment of a multi-package module having wire bond z-interconnection between stacked BGA and LGA semiconductor packages according to an aspect of the invention, in which the top package is provided with peripheral molding, and the module is provided with a heat spreader.

By way of example, FIG. 6B is a diagrammatic sketch in a sectional view showing a stacked BGA+LGA MPM 62 according to another aspect of the invention, in which a "top" heat spreader is provided at the upper surface of the MPM. The construction of the stacked packages in MPM 62 is generally similar to that of MPM 60 in FIG. 6A, and like structures are identified in the FIGS. by like reference numerals. The top heat spreader in this example is formed of a thermally conductive material having a generally planar central portion 644 situated over the top package, and peripheral supporting members 646 extending to the upper surface of the bottom package substrate 412. The upper surface of the planar portion 644 is exposed to ambient at the MPM upper surface for efficient heat exchange away from the MPM. The top heat spreader may be formed, for example, of a sheet of metal (such as copper), for example by stamping. The supporting members 646 can optionally be affixed to the upper surface of the bottom package substrate using an adhesive (not shown in the FIGS.). The multipackage module structure is protected by formation of a module encapsulant 607, and the heat spreader supporting members are embedded in the MPM encapsulant 607 during the molding material curing process. In the embodiment of FIG. 6B a step like re-entrant feature 645 is provided on the periphery of the planar upper portion 644 of the heat spreader to allow for better mechanical integrity of the structure with less delamination from the molding compound. In this embodiment the space between the lower surface of the heat spreader 644 and the upper surface of the die 614 is filled by a layer of the MPM molding that is thick enough so that the heatspreader 644 doe not interfere with the peripheral LGA molding 617.

Alternatively, a MPM as in the embodiment of FIG. 6A can be provided with a simple planar heat spreader, with no supporting members, that is not attached to the upper surface of the top package molding. In such embodiments, as in the embodiment of FIG. 5D, the top heat spreader can be a generally planar piece of a thermally conductive material such as, for example, a sheet of metal (such as copper), and at least the more central area of the upper surface of the planar heat spreader is exposed to ambient for efficient heat exchange away from the MPM. Here, as in the embodiment of FIG. 6B the space between the lower surface of the planar heat spreader and the upper surface of the die 614 is filled by a layer of the MPM molding that is thick enough so that the heatspreader does not interfere with the peripheral LGA molding 617. And here as in the embodiment of FIG. 6B such a simple planar heat spreader may be affixed to the MPM encapsulant 607 during the molding material curing process. The periphery of such an unattached simple planar top heat spreader can be encapsulated with the MPM molding material, as in the attached planar heat spreader of FIG. 5D, and may be provided with a step-like re-entrant feature on the periphery to allow for better mechanical integrity of the structure with less delamination from the molding compound.

As a further alternative in an embodiment as in FIG. 6A, to permit attachment of a simple planar heat spreader to the top package 600, a spacer may be provided between the lower surface of the simple planar top heat spreader and the upper surface of the die 614. The spacer may be affixed to the die and to the heat spreader using an adhesive; or, the spacer may be formed as an integral part, a spacer portion, of the heat spreader, and in such embodiments the lower surface of the spacer portion of the heat spreader may be affixed to the upper surface of the die using an adhesive. The spacer preferably is of a thermally conductive material, and the adhesive may be a thermally conductive adhesive, to provide improved heat dissipation. In such embodiments the top heat spreader may be affixed to the top package after the top package molding has been at least partly cured, but before the molding material is injected for the MPM encapsulation 607. The periphery of the top heat spreader may be encapsulated with the MPM molding material. As in the embodiment of FIG. 5D a step like re-entrant feature may be provided on the periphery of the simple planar heat spreader to allow for better mechanical integrity of the structure with less delamination from the molding compound.

An MPM structure having a heat spreader, as for example in FIG. 6B, can provide improved thermal performance.

Figure 7:
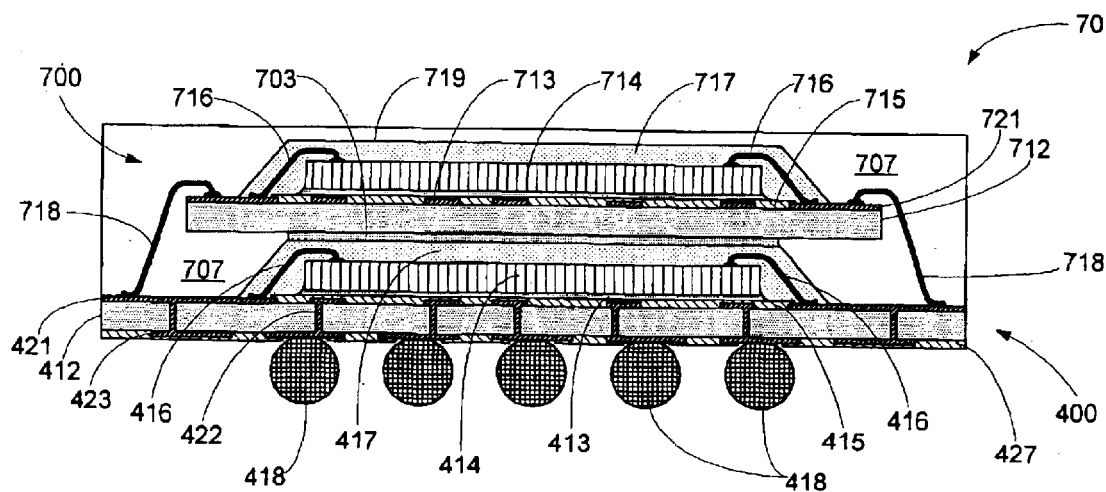
FIG. 7 is a diagrammatic sketch in a sectional view thru another embodiment of a multi-package module having wire bond z-interconnection between stacked BGA and LGA semiconductor packages according to an aspect of the invention, in which the top package substrate has a one metal layer substrate.

FIG. 7 is a diagrammatic sketch in a sectional view showing a stacked multipackage module according to another aspect of the invention, having a top LGA package stacked over a BGA bottom package, in which a one metal layer substrate is employed for the top LGA package. In other respects the configuration of FIG. 7 is substantially as shown in FIG. 5A. Accordingly, in this embodiment the bottom package 400 is constructed as described with reference to FIG. 5A, and the top package 700 is constructed substantially as described with reference to FIG. 5A, except for the difference in the structure of the top package substrate. Particularly, the top package 700 includes a die 714 attached onto a top package substrate 712 having one metal layer 721, patterned to provide appropriate circuitry. The die is conventionally attached to a surface of the substrate using an adhesive, typically referred to as the die attach epoxy, shown at 713 in FIG. 7 and, in the configuration in FIG. 7, the surface of the substrate onto which the die is attached may be referred to as the "upper" surface, and accordingly the metal layer on this substrate may be referred to as an "upper" or "top" metal layer, although the die attach surface need not have any particular orientation in use.

In the top LGA package in the embodiment of FIG. 7 the die is wire bonded onto wire bond sites on the upper metal layer of the substrate to establish electrical connections. The die 714 and the wire bonds 716 are encapsulated with a molding compound 717 that provides protection from ambient and from mechanical stress to facilitate handling operations. The encapsulant 717 in the embodiment as shown in FIG. 7 is configured as in the FIG. 5A embodiment, so that the encapsulant 717 covers the die as well as the wire bonds and their connections, and the encapsulant has a surface 719 over the entire die and interconnects. As will be appreciated, the encapsulant here can alternatively be formed as in the embodiment of FIG. 6A, that is, it may be formed such as to envelop the wire bonds and their respective connections to the top package substrate and the top package die only, so that much of the upper surface of the die is not covered by the encapsulant. The top package 700 is stacked over the bottom package 400 and affixed there using an adhesive, indicated at 703. Solder masks 715 are patterned over the metal layer 721 to expose the underlying metal at bonding sites for electrical connection, for example the wire bond sites for bonding the wire bonds 716.

The z-interconnect between the stacked top package 700 and bottom package 400 is made by way of wire bonds 718 connecting the top metal layers of the respective package substrates. The multipackage module structure is protected by formation of a module encapsulant 707, and solder balls 418 are reflowed onto exposed solder ball pads on the lower metal layer of the bottom package substrate, for connection to underlying circuitry, such as a motherboard (not shown in the FIGS.).

An advantage of this configuration is reduced cost as compared with a configuration employing a two metal layer substrate in the top LGA package, because of the lower cost of the one metal layer substrate. This configuration additionally provides a lower package profile because the one metal layer substrate is thinner than a substrate having two or more metal layers.

Figure 8A:
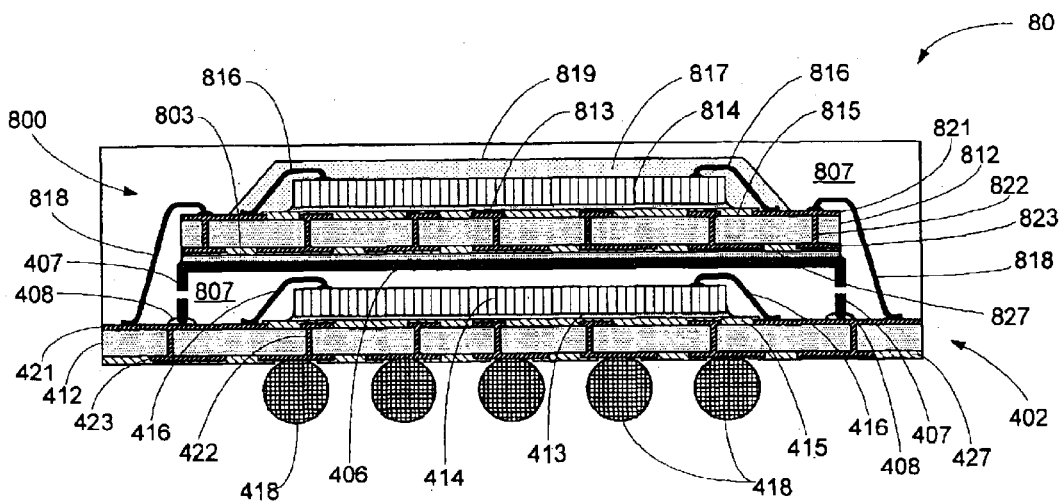
FIG. 8A is a diagrammatic sketch in a sectional view thru an embodiment of a multi-package module having wire bond z-interconnection between stacked BGA and LGA semiconductor packages according to a further aspect of the invention, in which an electrical shield is provided on the bottom package.

FIG. 8A is a diagrammatic sketch in a sectional view showing a stacked BGA+LGA MPM 80 according to another aspect of the invention, in which a heat spreader and electrical shield is provided to the bottom package. The embodiment shown by way of example in FIG. 8A has a top land grid array ("LGA") package 800 stacked over a bottom ball grid array "BGA" package 402, in which the top LGA package is constructed generally as is the top LGA package in FIG. 5A. As will be appreciated, a LGA having a single metal layer, as described with reference to FIG. 6A can alternatively be used as a top LGA in an embodiment of FIG. 8A. Referring to FIG. 8A, the top LGA package 800 may be similar to a BGA package, as shown for example in FIG. 1, but having no solder balls mounted on bonding pads of the lower surface of the substrate. Particularly, in this example, the top package 800 includes a die 814 attached onto a top package substrate 812 having at least one metal layer. Any of various substrate types may be used; the top package substrate 812 shown by way of example in FIG. 8A has two metal layers 821, 823, each patterned to provide appropriate circuitry and connected by way of vias 822. The die is conventionally attached to a surface of the substrate using an adhesive, typically referred to as the die attach epoxy, shown at 813 in FIG. 8A and, in the configuration in FIG. 8A, the surface of the substrate onto which the die is attached may be referred to as the "upper" surface, and the metal layer on that surface may be referred to as the "upper" or "top" metal layer, although the die attach surface need not have any particular orientation in use.

In the top LGA package in the embodiment of FIG. 8A the die is wire bonded onto wire bond sites on the upper metal layer of the substrate to establish electrical connections. The die 814 and the wire bonds 816 are encapsulated with a molding compound 817 that provides protection from ambient and from mechanical stress to facilitate handling operations, and has a top package upper surface 819. Solder masks 815, 827 are patterned over the metal layers 821, 823 to expose the underlying metal at bonding sites for electrical connection, for example the wire bond sites for bonding the wire bonds 816.

The bottom BGA package 402 in the embodiment of FIG. 8A is a conventional BGA package such as that shown in FIG. 1, except that the bottom BGA package of FIG. 8A is not encapsulated with a molding compound; rather, it is provided with a heat spreader that can additionally act as an electrical shield, as described below. Accordingly, in this embodiment the bottom package 402 includes a die 414 attached onto a bottom package substrate 412 having at least one metal layer. Any of various substrate types may be used, including for example: a laminate with 2–6 metal layers, or a build up substrate with 4–8 metal layers, or a flexible polyimide tape with 1–2 metal layers, or a ceramic multi-layer substrate. The bottom package substrate 412 shown by way of example in FIG. 8A has two metal layers 421, 423, each patterned to provide appropriate circuitry and connected by way of vias 422. The die is conventionally attached to a surface of the substrate using an adhesive, typically referred to as the die attach epoxy, shown at 413 in FIG. 8A and, in the configuration in FIG. 8A, the surface of the substrate onto which the die is attached may be referred to as the "upper" surface, and the metal layer on that surface may be referred to as the "upper" metal layer, although the die attach surface need not have any particular orientation in use.

In the bottom BGA package of FIG. 8A the die is wire bonded onto wire bond sites on the upper metal layer of the substrate to establish electrical connections. Solder balls 418 are reflowed onto bonding pads on the lower metal layer of the substrate to provide interconnection to underlying circuitry of, for example, a motherboard (not shown in the FIGS.) of a final product, such as a computer. Solder masks 415, 427 are patterned over the metal layers 421, 423 to expose the underlying metal at bonding sites for electrical connection, for example the wire bond sites and bonding pads for bonding the wire bonds 416 and solder balls 418.

The bottom BGA package 402 of multipackage module 80 is provided with a metallic (for example, copper) heat spreader that acts additionally as an electrical shield to electrically contain any electromagnetic radiation from the die in the lower BGA and thereby prevent interference with the die in the upper package. A "top" planar part of the heat spreader 406 is supported above the substrate 412 and over the die 414 by legs or sidewalls 407. Spots or lines 408 of an adhesive serve to affix the heat spreader support 407 to the upper surface of the bottom substrate. The adhesive can be a conductive adhesive, and can be electrically connected to the top metal layer 421 of the substrate 412, particularly to a ground plane of the circuit and thereby establishing the heat spreader as an electrical shield. Or, the adhesive can be non-conductive and in such a configuration the heat spreader acts only as a heat spreading device. The supporting parts and the top part of the heat spreader 406 enclose the die 414 and the wire bonds 416, and can serve to protect those structures from ambient and from mechanical stress to facilitate handling operations and, particularly, during subsequent testing before the MPM assembly.

The top package 800 of multipackage module 80 is stacked over the bottom package 402 upon the planar surface of the heat spreader/shield 406 and affixed there using an adhesive 803. The adhesive 803 can be thermally conductive, to improve thermal dissipation; and the adhesive 803 can be electrically conductive, to establish electrical connection of the heat spreader 406 to a lower metal layer of the LGA package substrate, or it can be electrically insulating, thereby preventing electrical connection.

The z-interconnection between the top package 800 and the bottom package 402 according to the invention is made by wire bonds 818 between top package interconnect pads in the margin of the top package substrate 812 and bottom package interconnect pads in the margin of the bottom package substrate 402. The wire bonds may be formed in either up-bond or down-bond fashion. The multipackage module structure is protected by formation of a module encapsulant 807. Openings may be provided in the supporting parts 407 of the heat spreader to allow the MPM molding material to fill in the enclosed space during encapsulation.

Solder balls 418 are reflowed onto exposed solder ball pads on the lower metal layer of the bottom package substrate 412, for connection to underlying circuitry, such as a motherboard (not shown in the FIGS.).

As will be appreciated from the foregoing, the structure according to the invention allows for pre-testing of both the BGA and LGA before assembly into the multi-package module, to permit rejection of nonconforming packages prior to assembly, and thereby to assure high final module test yields.

For improved heat dissipation from the multi-package module, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper), and it may be affixed to the MPM encapsulant during the molding material curing process. Or, the heatspreader may have a generally planar portion over the top package, and a peripheral supporting portion or supporting members resting on or near the upper surface of the bottom package substrate.

Figure 8B:
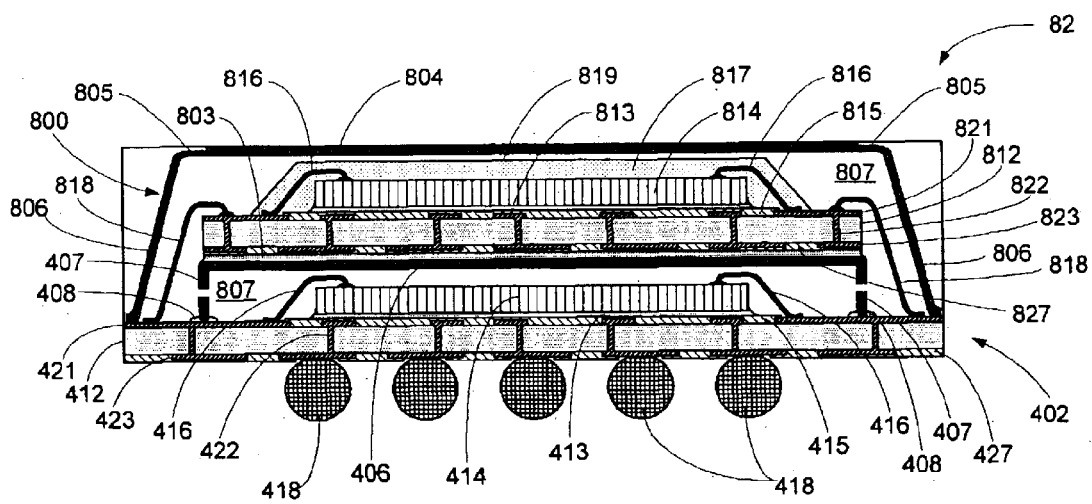
FIG. 8B is a diagrammatic sketch in a sectional view thru another embodiment of a multi-package module having wire bond z-interconnection between stacked BGA and LGA semiconductor packages according to an aspect of the invention, in which an electrical shield is provided on the bottom package, and the module is provided with a heat spreader.

By way of example, FIG. 8B is a diagrammatic sketch in a sectional view showing a stacked BGA+LGA MPM 82 according to another aspect of the invention, in which a "top" heat spreader is provided at the upper surface of the MPM. The construction of the stacked packages in MPM 82 is generally similar to that of MPM 80 in FIG. 8A, and like structures are identified in the FIGS. by like reference numerals. The top heat spreader in this example is formed of a thermally conductive material having a generally planar central portion 804 situated over the top package, and peripheral supporting members 806 extending to the upper surface of the bottom package substrate 412. the upper surface of the planar portion 804 is exposed to ambient at the MPM upper surface for efficient heat exchange away from the MPM. The top heat spreader may be formed, for example, of a sheet of metal (such as copper), for example by stamping. The supporting members 806 can optionally be affixed to the upper surface of the bottom package substrate using an adhesive (not show in the FIGS.). The multi-package module structure is protected by formation of a module encapsulant 807, and the heat spreader supporting members are embedded in the MPM encapsulant 807 during the molding material curing process. In the embodiment of FIG. 8B a step like re-entrant feature 805 is provided on the periphery of the planar upper portion 804 of the heat spreader to allow for better mechanical integrity of the structure with less delamination from the molding compound. In this embodiment the space between the lower surface of the heat spreader 804 and the upper surface 819 of the LGA molding 817 is filled by a thin layer of the MPM molding.

Figure 8C:
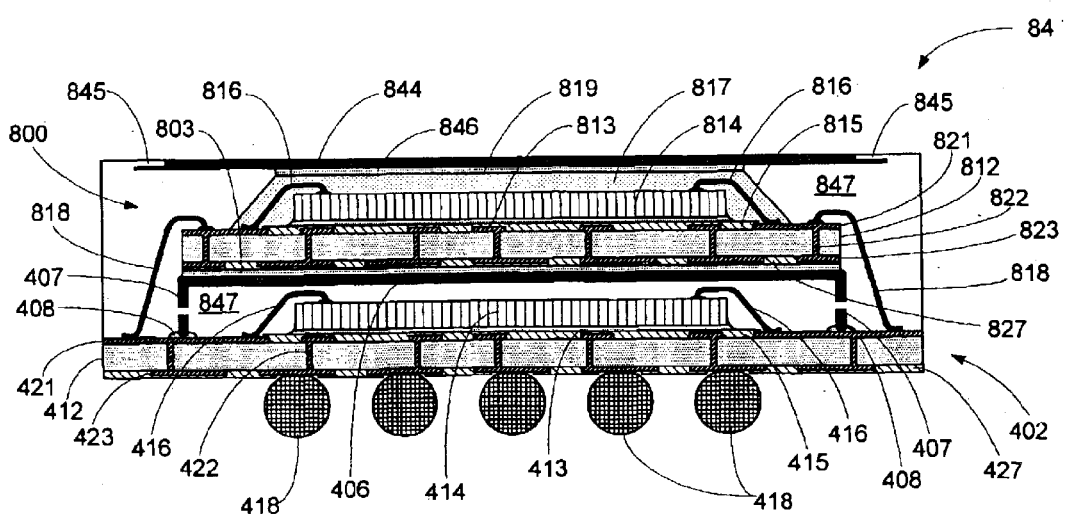
FIG. 8C is a diagrammatic sketch in a sectional view thru another embodiment of a multi-package module having wire bond z-interconnection between stacked BGA and LGA semiconductor packages according to an aspect of the invention, in which an electrical shield is provided on the bottom package, and the module is provided with a heat spreader affixed to an upper surface of the top package.

Alternatively, the top heat spreader can be a generally planar piece of a thermally conductive material such as, for example, a sheet of metal (such as copper), with no supporting members. At least the more central area of the upper surface of the planar heat spreader is exposed to ambient for efficient heat exchange away from the MPM. Such a simple planar heat spreader is shown in FIG. 8C at 844, where the heat spreader is affixed to an upper surface of the top package molding. In FIG. 8B, however, the heat spreader is not attached to the upper surface of the top package molding. Instead, the space between the lower surface of the simple planar heat spreader and the upper surface 819 of the LGA molding 817 is filled by a thin layer of the MPM molding, and such a simple planar heat spreader may be affixed to the MPM encapsulant 807 during the molding material curing process. The periphery of a simple planar top heat spreader can in an embodiment such as in FIG. 8B be encapsulated with the MPM molding material, and may be provided with a step-like re-entrant feature on the periphery (refer to re-entrant feature 845 in the simple planar heat spreader 844 in FIG. 8C) to allow for better mechanical integrity of the structure with less delamination from the molding compound.

Alternatively, a top heat spreader can be affixed to the upper surface of the LGA molding as shown diagrammatically in a sectional view in FIG. 8C. The construction of the stacked packages in MPM 84 is generally similar to that of MPM 80 in FIG. 8A, and like structures are identified in the FIGS. by like reference numerals. The top heat spreader 844 in the example of FIG. 8C is a generally planar piece of a thermally conductive material having at least the more central area of its upper surface exposed to ambient for efficient heat exchange away from the MPM, as in the example of FIG. 8B. The top heat spreader may be, for example, a sheet of metal (such as copper). Here, however, the top heat spreader 804 is affixed onto the upper surface 819 of the upper package encapsulant 817 using an adhesive 846. The adhesive 846 may be a thermally conductive adhesive, to provide improved heat dissipation. Usually the top heat spreader is affixed to the top package molding after the top package molding has been at least partly cured, but before the molding material is injected for the MPM encapsulation 847. The periphery of the top heat spreader may be encapsulated with the MPM molding material. In the embodiment of FIG. 8C a step like re-entrant feature 845 is provided on the periphery of the heat spreader 844 to allow for better mechanical integrity of the structure with less delamination from the molding compound.

An advantage of a structure as in FIGS. 8A, 8B, 8C is significant thermal performance and, optionally, electrical shielding at the bottom package, which can be particularly important critical, for example, in MPM that combine RF and digital chips. It is not necessary to have both a bottom package heat spreader and a top heat spreader for all applications. Alternately one or the other may be adequate depending on the end product needs.

Figure 9A:
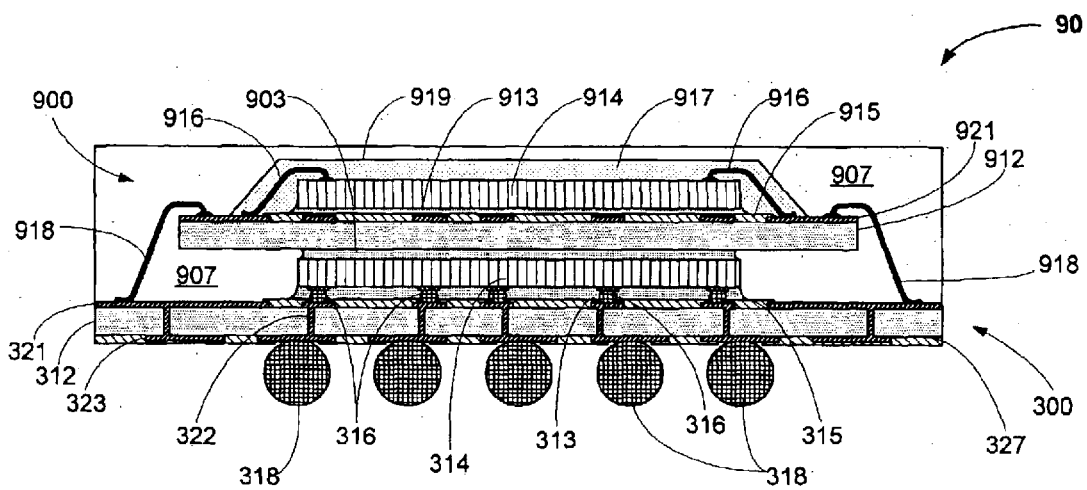
FIG. 9A is a diagrammatic sketch in a sectional view thru a multi-package module having wire bond z-interconnection between stacked flip-chip BGA (die down) and LGA semiconductor packages according to a further aspect of the invention.

FIG. 9A is a diagrammatic sketch in a sectional view showing a multi-package module according to another aspect of the invention, in which a flip chip BGA with die down is stacked with an LGA. In the lower BGA the die is flip chip connected to the substrate and the space between the die and the substrate is underfilled. This BGA can be tested before assembly into the MPM. The back of the die is available to attach the top LGA with adhesive. The z-interconnect of the top LGA to the module substrate is via wire bonding and the MPM is molded. A primary advantage of this configuration is that the flip chip connection on the BGA provides for high electrical performance.

Referring to FIG. 9A, the bottom BGA flip chip package includes a substrate 312 having a patterned metal layer 321 onto which the die 314 is connected by flip chip bumps 316, such as solder bumps, gold stud bumps or anisotropically conducting film or paste. Any of various substrate types may be used; the bottom package substrate 312 shown by way of example in FIG. 9A has two metal layers 321, 323, each patterned to provide appropriate circuitry and connected by way of vias 322. The flip chip bumps are affixed to a patterned array of bump pads on the active surface of the die and, as the active surface of the die faces downward in relation to an upward-facing patterned metal layer of the substrate, such an arrangement may be referred to as a "die down" flip chip package. A polymer underfill 313 between die and substrate provides protection from ambient and adds mechanical integrity to the structure.

The top LGA package 900 of multipackage module 90 is constructed generally similarly to the top LGA package 700 of the multipackage module 70 of FIG. 7. Particularly, the top package 900 includes a die 914 attached onto a top package substrate 912 having one metal layer 921, patterned to provide appropriate circuitry. The die is conventionally attached to a surface of the substrate using an adhesive, typically referred to as the die attach epoxy, shown at 913 in FIG. 9A and, in the configuration in FIG. 9A, the surface of the substrate onto which the die is attached may be referred to as the "upper" surface, and accordingly the metal layer on this substrate may be referred to as an "upper" or "top" metal layer, although the die attach surface need not have any particular orientation in use.

In the top LGA package in the embodiment of FIG. 9A the die is wire bonded onto wire bond sites on the upper metal layer of the substrate to establish electrical connections. The die 914 and the wire bonds 916 are encapsulated with a molding compound 917 that provides protection from ambient and from mechanical stress to facilitate handling operations. The encapsulant 917 in the embodiment as shown in FIG. 9A covers the die as well as the wire bonds and their connections, and the encapsulant has a surface 919 over the entire die and interconnects. As will be appreciated, the encapsulant here can alternatively be formed as in the embodiment of FIG. 6A, that is, it may be formed such as to envelop the wire bonds and their respective connections to the top package substrate and the top package die only, so that much of the upper surface of the die is not covered by the encapsulant. The top package 900 is stacked over the bottom package 300 and affixed there using an adhesive, indicated at 903. Solder masks 915 are patterned over the metal layer 921 to expose the underlying metal at bonding sites for electrical connection, for example the wire bond sites for bonding the wire bonds 916.

The z-interconnect between the stacked top package 900 and bottom package 300 is made by way of wire bonds 918 connecting the top metal layers of the respective package substrates. The multipackage module structure is protected by formation of a module encapsulant 907, and solder balls 318 are reflowed onto exposed solder ball pads on the lower metal layer of the bottom package substrate, for connection to underlying circuitry, such as a motherboard (not shown in the FIGS.) of a final product, such as a computer. Solder masks 315, 327 are patterned over the metal layers 321, 323 to expose the underlying metal at bonding sites for electrical connection, for example the wire bond sites and bonding pads for bonding the wire bonds 918 and solder balls 318.

Structures having a LGA stacked over a flip chip BGA with die down as described for example with reference to FIG. 9A can be assembled with a heat spreader/electrical shield much as shown in FIG. 8B or FIG. 8C. Accordingly, FIG. 9B is a diagrammatic sketch in a sectional view showing a multi-package module according to another aspect of the invention, in which a flip chip BGA with die down is stacked with an LGA, as in the embodiment of FIG. 9A, and in which the lower BGA is provided with a heat spreader/shield.

Figure 9B:
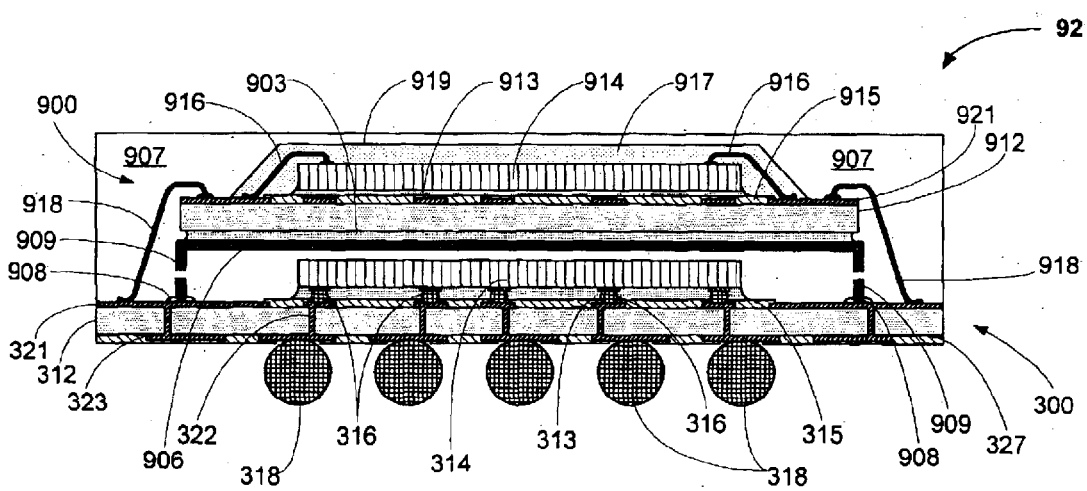
FIG. 9B is a diagrammatic sketch in a sectional view thru a multi-package module having wire bond z-interconnection between stacked flip-chip BGA (die down) and LGA semiconductor packages according to a further aspect of the invention, in which an electrical shield is provided on the bottom package.

Particularly, referring to FIG. 9B, the bottom BGA package 300 of multipackage module 92 is provided with a metallic (for example, copper) heat spreader that acts additionally as an electrical shield to electrically contain any electromagnetic radiation from the die in the lower BGA and thereby prevent interference with the die in the upper package. A "top" planar part of the heat spreader 906 is supported above the substrate 312 and over the die 314 by legs or sidewalls 909. Spots or lines 908 of an adhesive serve to affix the heat spreader support 909 to the upper surface of the bottom substrate. The adhesive can be a conductive adhesive, and can be electrically connected to the top metal layer 321 of the substrate 312, particularly to a ground plane of the circuit and thereby establishing the heat spreader as an electrical shield. Or, the adhesive can be non-conductive and in such a configuration the heat spreader acts only as a heat spreading device. The supporting parts and the top part of the heat spreader 906 enclose the die 314, and can serve for protection from ambient and from mechanical stress to facilitate handling operations and, particularly, during subsequent testing before the MPM assembly.

The top package 900 of multipackage module 92 is stacked over the bottom package 300 upon the planar surface of the heat spreader/shield 906 and affixed there using an adhesive 903. The adhesive 903 can be thermally conductive, to improve thermal dissipation; and the adhesive 903 can be electrically conductive, to establish electrical connection of the heat spreader 906 to a lower metal layer of the LGA package substrate, or it can be electrically insulating, thereby preventing electrical connection.

The z-interconnection between the top package 900 and the bottom package 300 according to the invention is made by wire bonds 918 between top package interconnect pads in the margin of the top package substrate 912 and bottom package interconnect pads in the margin of the bottom package substrate 300. The wire bonds may be formed in either up-bond or down-bond fashion. The multipackage module structure is protected by formation of a module encapsulant 907. Openings may be provided in the supporting parts 907 of the heat spreader to allow the MPM molding material to fill in the enclosed space during encapsulation.

Solder balls 318 are reflowed onto exposed solder ball pads on the lower metal layer of the bottom package substrate 300, for connection to underlying circuitry, such as a motherboard (not shown in the FIGS.).

As will be appreciated from the foregoing, the structure according to the invention allows for pre-testing of both the BGA and LGA before assembly into the multi-package module, to permit rejection of nonconforming packages prior to assembly, and thereby to assure high final module test yields.

The processor chip in a flip chip bottom package according to this aspect of the invention can be, for example, an ASIC, or a GPU, or a CPU, often an ASIC; and the top package can be a memory package or an ASIC package. Where the top package is a memory package it can be a stacked die memory package. A shielded flip chip die-down bottom package can be particularly suitable for higher speed applications, particularly for rf frequency processing, as in mobile communications applications.

Optionally, a MPM having a flip chip bottom package in a die-down configuration (as shown for example in FIG. 9A or FIG. 9B) may be provided with a heat spreader.

For improved heat dissipation from the multi-package module as shown for example in FIG. 9A or 9B, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper), and it may be affixed to the MPM encapsulant during the molding material curing process. Or, the heatspreader may have a generally planar portion over the top package, and a peripheral supporting portion or supporting members resting on or near the upper surface of the bottom package substrate.

Figure 9C:
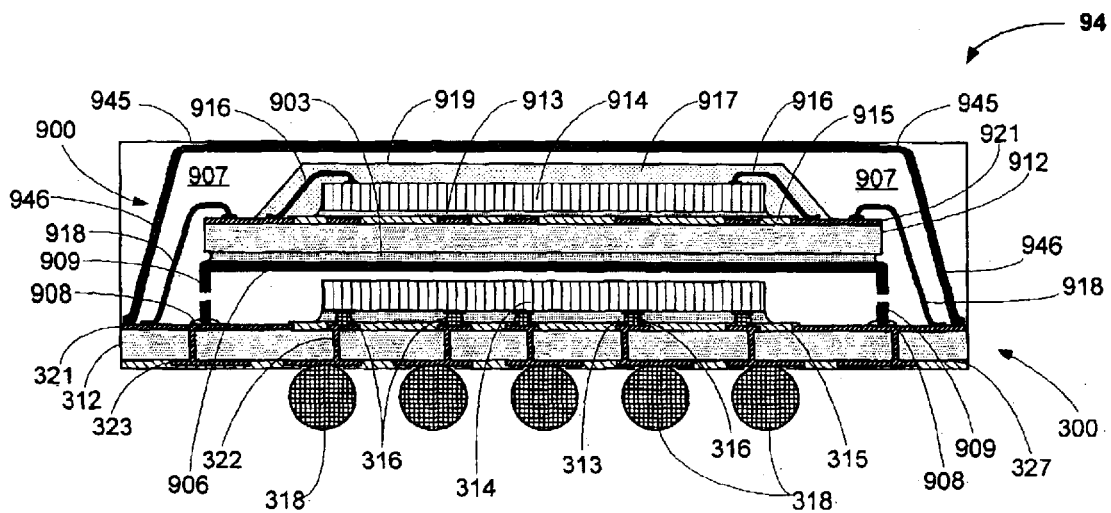
FIG. 9C is a diagrammatic sketch in a sectional view thru a multi-package module having wire bond z-interconnection between stacked flip-chip BGA (die down) and LGA semiconductor packages according to a further aspect of the invention, in which an electrical shield is provided on the bottom package, and the module is provided with a heat spreader.

By way of example, FIG. 9C is a diagrammatic sketch in a sectional view showing a stacked BGA+LGA MPM 94 according to another aspect of the invention, in which a "top" heat spreader is provided at the upper surface of the MPM. The construction of the stacked packages in MPM 94 is generally similar to that of MPM 92 in FIG. 9B, and like structures are identified in the FIGS. by like reference numerals. The top heat spreader in this example is formed of a thermally conductive material having a generally planar central portion 944 situated over the top package, and peripheral supporting members 946 extending to the upper surface of the bottom package substrate 312. The upper surface of the planar portion 944 is exposed to ambient at the MPM upper surface for efficient heat exchange away from the MPM. The top heat spreader may be formed, for example, of a sheet of metal (such as copper), for example by stamping. The supporting members 946 can optionally be affixed to the upper surface of the bottom package substrate using an adhesive (not shown in the FIGS.). The multi-package module structure is protected by formation of a module encapsulant 907, and the heat spreader supporting members are embedded in the MPM encapsulant 907 during the molding material curing process. In the embodiment of FIG. 9C a step like re-entrant feature 945 is provided on the periphery of the planar upper portion 944 of the heat spreader to allow for better mechanical integrity of the structure with less delamination from the molding compound. In this embodiment the space between the lower surface of the heat spreader 944 and the upper surface of the die 914 is filled by a layer of the MPM molding that is thick enough so that the heatspreader 944 doe not interfere with the peripheral LGA molding 917.

Alternatively, a MPM as in the embodiment of FIG. 9A or FIG. 9B can be provided with a simple planar heat spreader, with no supporting members. Such a simple planar heat spreader may be affixed, using an adhesive, to the upper surface 519 of the top package molding 517. Or, alternatively, MPM as in the embodiment of FIG. 9A or FIG. 9B can be provided with a simple planar heat spreader that is not attached to the upper surface of the top package molding. In such embodiments, as in the embodiment of FIG. 5D, the top heat spreader can be a generally planar piece of a thermally conductive material such as, for example, a sheet of metal (such as copper), and at least the more central area of the upper surface of the planar heat spreader is exposed to ambient for efficient heat exchange away from the MPM. Here, as in the embodiment of FIG. 9C, the space between the lower surface of the planar heat spreader and the top package 900 is filled by a layer of the MPM. And here as in the embodiment of FIG. 9C such a simple planar heat spreader may be affixed to the MPM encapsulant 907 during the molding material curing process. The periphery of such an unattached simple planar top heat spreader can be encapsulated with the MPM molding material, as in the attached planar heat spreader of FIG. 5D, and may be provided with a step-like re-entrant feature on the periphery to allow for better mechanical integrity of the structure with less delamination from the molding compound.

An MPM structure having a heat spreader, as for example in FIG. 9C, can provide improved thermal performance.

The bottom package of the MPM according to the invention can be a flip chip package in a die-up configuration, in which the bottom package die is carried on the lower surface of the bottom package substrate. Usually the bottom package die attach region in such a configuration is situated about the center of the substrate area, and the second-level interconnect balls are arranged peripherally near two or (more usually) for of the substrate edges. The die-up flip chip and its flip chip interconnect structures are located within the standoff height of the second-level interconnect structures, and, accordingly, the bottom package die in such configurations contributes nothing to the overall thickness of the MPM. Moreover, the die-up configuration can avoid a netlist inversion effect, which typically is a consequence of die-down configuration.

Figure 10A:
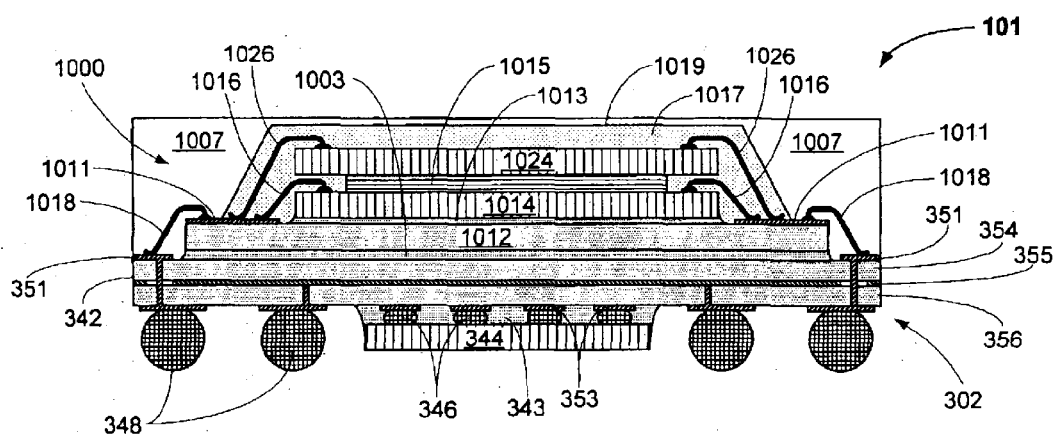
FIG. 10A is a diagrammatic sketch in a sectional view thru a multi-package module having wire bond z-interconnection between stacked flip-chip BGA (die up) and stacked die LGA semiconductor packages according to a further aspect of the invention, in which adjacent stacked die in the second package are separated by a spacer.

Particularly, by way of example, FIG. 10A is a diagrammatic sketch in a sectional view showing a multi-package module 101 according to another aspect of the invention, in which a stacked-die land grid array package 1000 is stacked over a flip chip BGA in a die-up configuration 302, and the stacked packages are interconnected by wire bonding. In the bottom BGA package 302 the die 344 is attached on the lower side of the BGA substrate 342.

As the FIG. illustrates, this structure provides for a thinner MPM because the bottom package die is on the underside of the bottom package in the area between the peripherally situated solder balls. Such a configuration can have a higher electrical performance not only because it employs a flip chip connection but also because it provides more direct electrical connection of the die to the solder balls, with shorter metal traces and without requiring vias (as are required in a configuration as in FIGS. 9A or 9B) for connection between the die and the solder balls. Furthermore the die-up configuration enables this package to be netlist compatible to wire bonding, as may be desired in some applications. Netlist is the sum of all pairs of connections between the die and the solder balls. When the die faces up "die-down" it has a connection pattern that is the mirror image of the pattern in the same die when the die is facing down "die-up".

Figure 10B:
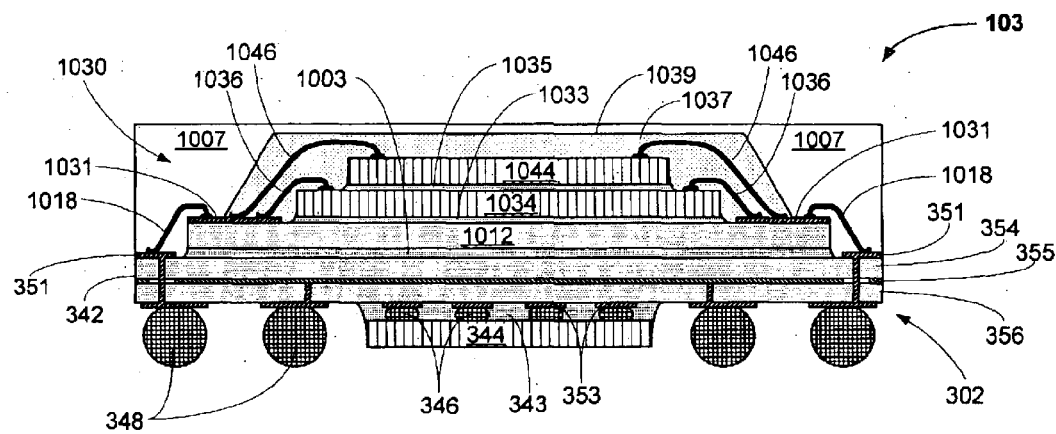
FIG. 10B is a diagrammatic sketch in a sectional view thru a multi-package module having wire bond z-interconnection between stacked flip-chip BGA (die up) and stacked die LGA semiconductor packages according to a further aspect of the invention, in which adjacent stacked die in the second package are of different sizes.

In a configuration as in FIG. 10A the top LGA package is attached with adhesive onto the upper side of the BGA, and then is wire bonded and molded. In the embodiment shown by way of example in FIGS. 10A through 10E more than one die (two or more) are stacked in the top package. Stacked die packages are well established in the industry, with versions that have up to 5 stacked die in the package. The die have various sizes, and the die in a stacked die package may have the same or different relative sizes. The die are typically square or rectangular, and rectangular and square die of various dimensions may be stacked in a stacked die package. Where the die are rectangular, or have various dimensions, the die may be stacked so that the margin of a lower die in the stack projects beyond the margin of an upper die that is stacked over it. FIG. 10A shows an example in which the two die in the stack are of the same size. In such embodiments, or in embodiments where an upper die in the stack is larger than a lower one, a spacer is assembled between the die to enable wire bonding of all the die to the LGA substrate. FIG. 10B shows an example in which the upper die in the stack is smaller then a lower one; or, alternatively, the die are stacked so that the margin of the upper stack projects beyond the margin of the lower stack. In embodiments such as in FIG. 10B no spacer is necessary, because wire bond sites in the projecting margin of the lower die allows for wire bonding without interference from the die that is stacked over it.

Referring to FIG. 10A, the bottom flip chip BGA package 302 includes a substrate 342 having a patterned metal layer 353 onto parts of which the die 344 is connected by flip chip bumps 346, such as solder bumps, gold stud bumps or anisotropically conducting film or paste. Any of various substrate types may be used; the bottom package substrate 342 shown by way of example in FIG. 10A has two metal layers 351, 353, each patterned to provide appropriate circuitry. Bottom package substrate 342 additionally has a metal layer 355 sandwiched between dielectric layers 354, 356. Metal layer 355 has voids at selected locations, to permit connection of the metal layers 351, 353 by vias therethrough and, accordingly, selected parts of the patterned metal layers 351, 353 are connected by way of vias through the substrate layers 354, 356 and through the voids in the sandwiched metal layer 355. Selected parts of the patterned metal layer 353 are connected by way of vias through substrate layer 356 to sandwiched metal layer 355.

Flip chip bumps 346 are attached to a patterned array of bump pads on the active surface of the die and, as the active surface of the die faces upward in relation to an downward-facing patterned metal layer of the substrate, such an arrangement may be referred to as a "die up" flip chip package. A polymer underfill 343 between the die and the die attach region of the substrate provides protection from ambient and adds mechanical integrity to the structure.

As noted above, the metal layers 351, 353 are patterned to provide appropriate circuitry, and the sandwiched metal layer 355 has voids at selected locations to allow interconnections (without contact with the sandwiched metal layer 355) between selected traces on the upper and lower metal layers 351, 353. Particularly, for example, the lower metal layer is patterned in the die attach area to provide attachment sites for the flip chip interconnect bumps 353; and, for example, the lower metal layer is patterned nearer the margin of the bottom package substrate 342 to provide attachment sites for the second-level interconnect solder balls 348, by which the completed MPM is attached by solder reflow to underlying circuitry (not shown). And particularly, for example, the upper metal layer is patterned near the margin of the bottom package substrate 342 to provide attachment sites for wire bonds connecting the top package to the bottom package. Ground lines in the circuitry of metal layer 353 are connected through vias to the sandwiched metal layer 355; selected ones of the solder balls 348 are ground balls, which will be attached to ground lines in the underlying circuitry when the MPM is installed. Thus, the sandwiched metal layer 355 serves as a ground plane for the MPM. Selected others of the solder balls 348 are input/output balls or power balls, and these are, accordingly, attached to solder ball sites on input/output or power lines, respectively, in the circuitry of metal layer 353.

Referring still to FIG. 10A, the top package 1000 is a stacked die land grid array package, having die 1014, 1024 separated by a spacer 1015 and stacked over a top package substrate. The top package substrate includes a dielectric layer 1012 having a metal layer on the upper substrate surface, and patterned to provide traces, for example 1031, provided with attachment sites for wire bond interconnect of the top package substrate with the stacked die and for wire bond interconnect of the top package with the bottom package substrate. Lower die 1014 is attached to a die attach area of the top package substrate using an adhesive 1013 such as a die attach epoxy. Die 1014 is electrically connected to the top substrate by way of wire bonds 1016 connecting wire bond sites on the active surface of die with wire bond sites on selected traces 1011. A spacer 1015 is affixed to the upper surface of the lower die 1014 using an adhesive (not shown in the FIG.), and upper die 1024 is affixed to the upper surface of the spacer 1015 using an adhesive (not shown). The spacer is selected to be sufficiently thick to provide clearance so that the overhanging margins of upper die 1024 do not impinge upon the wire bonds 1016. Die 1024 is electrically connected to the top substrate by way of wire bonds 1026 connecting wire bond sites on the active surface of die with wire bond sites on selected traces 1011. The assembly of stacked die and wire bonds over the top package substrate is encapsulated in a molding material 1017 providing a top package upper surface 1019, and leaving marginal portions of the interconnect traces 1011 exposed. The top package 1000 may at this point be tested, and then stacked onto a die attach area of the upper surface of the bottom package substrate, and affixed there using an adhesive 1003. Electrical interconnect of the top and bottom packages is effected by wire bonds 1018 connecting exposed wire bond sites on the traces 1011 of the top package substrate with wire bond sites on traces 351 of the upper metal layer of the bottom package substrate. The MPM assembly is then encapsulated in a molding 1007 to protect the package-to-package wire bonds and to provide mechanical integrity in the completed MPM 101.

As noted above, the stacked die top package that is stacked over the die-up flip chip BGA package in such embodiments may have various configurations, depending for example upon the number of die in the stack, and upon the dimensions of the die. For example, FIG. 10B shows, in a diagrammatic sectional view, an alternative MPM configuration 103 in which the LGA has two stacked die and in which the upper die 1044 has a smaller dimension than the lower die 1034, at least in the plane of the sectional view. In such a configuration there is no marginal overhang of the upper die over the wire bond attachment sites in the margin of the lower die, and so it is unnecessary to include a spacer. The bottom package 302 in MPM 103 of FIG. 10B is substantially similar to the bottom package in MPM 101 of FIG. 10A, and corresponding parts are similarly identified in the FIGS. The top package 1030 in MPM 103 is a stacked die land grid array package, having die 1034, 1044 stacked over a top package substrate. The top package substrate includes a dielectric layer 1012 having a metal layer on the upper substrate surface, and patterned to provide traces, for example 1031, provided with attachment sites for wire bond interconnect of the top package substrate with the stacked die and for wire bond interconnect of the top package with the bottom package substrate. Lower die 1034 is attached to a die attach area of the top package substrate using an adhesive 1033 such as a die attach epoxy. Die 1034 is electrically connected to the top substrate by way of wire bonds 1036 connecting wire bond sites on the active surface of die with wire bond sites on selected traces 1031. Upper die 1044 is affixed to the upper surface of lower die 1034 using an adhesive 1035. Die 1044 is electrically connected to the top substrate by way of wire bonds 1046 connecting wire bond sites on the active surface of die with wire bond sites on selected traces 1031. The assembly of stacked die and wire bonds over the top package substrate is encapsulated in a molding material 1037 providing a top package upper surface 1039, and leaving marginal portions of the interconnect traces 1031 exposed. The top package 1030 may at this point be tested, and then stacked onto a die attach area of the upper surface of the bottom package substrate, and affixed there using an adhesive 1003. Electrical interconnect of the top and bottom packages is effected by wire bonds 1018 connecting exposed wire bond sites on the traces 1031 of the top package substrate with wire bond sites on traces 351 of the upper metal layer of the bottom package substrate. The MPM assembly is then encapsulated in a molding 1007 to protect the package-to-package wire bonds and to provide mechanical integrity in the completed MPM 103.

The processor chip in a flip chip bottom package according to this aspect of the invention can be, for example, an ASIC, or a GPU, or a CPU; and the top package can be a memory package, particularly for example, as illustrated in FIGS. 10A, 10B, a stacked die memory package. A flip chip die-up configuration for the bottom package can provide a very thin module, and can be particularly suitable for higher speed applications such as mobile communications.

As will be appreciated, the ground plane 355 in the bottom package substrate in an embodiment such as MPM 101 or 103 additionally serves as an electromagnetic shield to significantly reduce interference between the BGA die and the overlying LGA die, and such a MPM can be particularly useful in applications where the bottom package die is a high frequency (e.g., radio frequency) die.

Figure 10C:
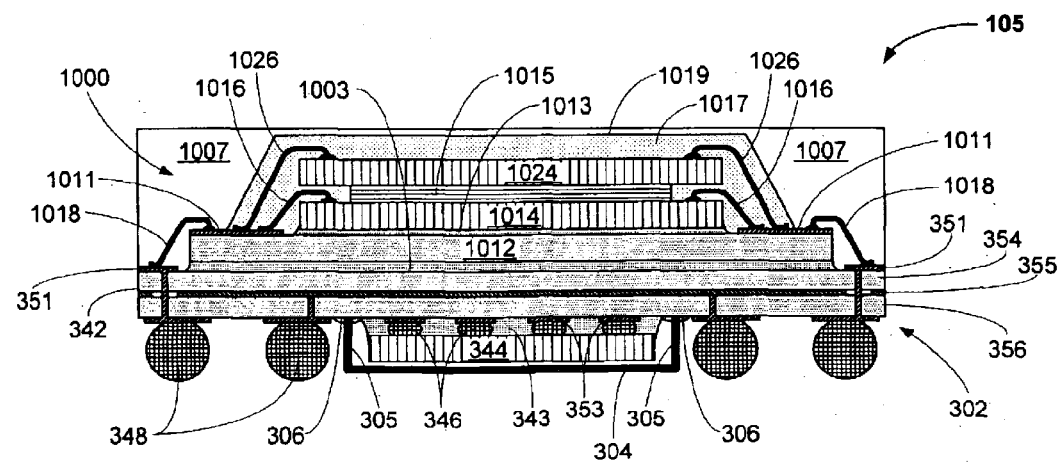
FIG. 10C is a diagrammatic sketch in a sectional view thru a multi-package module having wire bond z-interconnection between stacked flip-chip BGA (die up) and stacked die LGA semiconductor packages according to a further aspect of the invention, and in which an electrical shield is provided on the bottom package.

In some applications it may be desirable also to shield the BGA die in the bottom package from the underlying circuitry to which the MPM is attached. FIG. 10C shows an example of a multi-package module 105 in which a stacked-die land grid array package 1000 is stacked over a flip chip BGA in a die-up configuration 302, in which the stacked packages are interconnected by wire bonding, and in which an electromagnetic shield is provided at the flip chip BGA die to limit radiation downward toward the underlying circuitry (not shown).

In the MPM 105 of FIG. 10C the top package 1000 and the bottom package 302 are constructed substantially as in MPM 101 of FIG. 10A, and corresponding features are correspondingly identified in the FIGS. The bottom package 302 of MPM 105 is provided with a metallic (for example, copper) electrical shield to electrically contain electromagnetic radiation from the die in the lower BGA and thereby prevent interference with circuitry underlying the installed MPM. A lower planar part of the shield 304 is supported by legs or sidewalls 305. Spots or lines 306 of an adhesive serve to affix the heat spreader support 305 to the lower surface of the bottom substrate. The adhesive can be a conductive adhesive, and can be electrically connected to traces in the lower metal layer of the substrate, particularly to ground traces of the circuit. The supporting parts and the lower planar part of the shield enclose the die 344 and, in addition to shielding the lower die in the completed device, can serve to protect the lower die from ambient and from mechanical stress to facilitate handling operations and, particularly, during subsequent testing before assembly of the MPM or before installation.

Alternatively, as will be appreciated, a shield as described with reference to FIG. 10C can be employed to shield a die-up flip chip bottom package 302 in MPM having other stacked die top package configurations. The stacked die top package may, for example, have no spacer between adjacent die, as shown generally at 1030 in FIG. 10B.

And alternatively, a shield as described with reference to FIG. 10C can be employed to shield a die-up flip chip bottom package 302 in MPM having top packages other than stacked die top packages. The top package may, for example, be a land grid array package, such as for example the LGA top package shown generally at 500 in FIG. 5A.

Moreover, for improved heat dissipation from a multi-package module configured generally as in FIG. 10A, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper), and it may be affixed to the MPM encapsulant during the molding material curing process. Or, the heatspreader may have a generally planar portion over the top package, and a peripheral supporting portion or supporting members resting on or near the upper surface of the bottom package substrate.

Figure 10D:
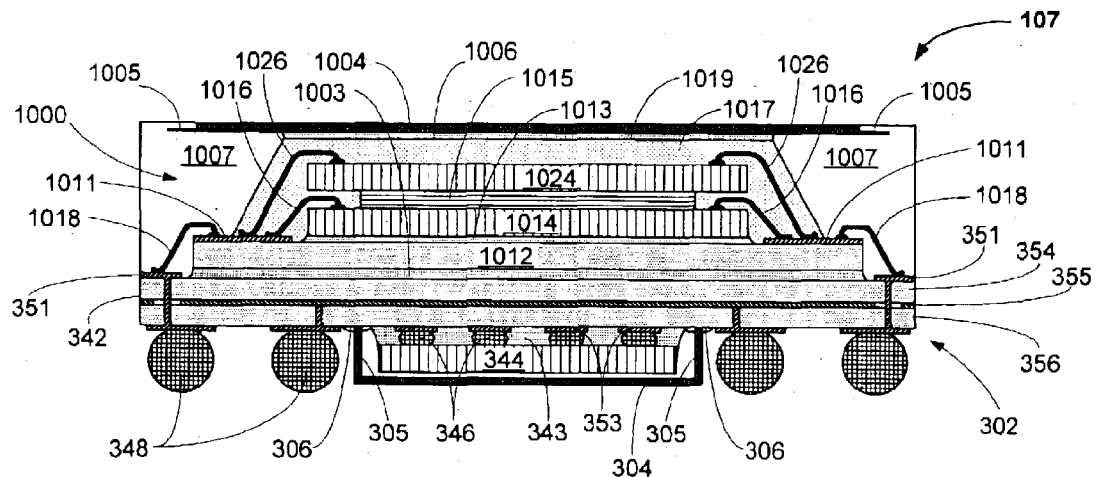
FIG. 10D is a diagrammatic sketch in a sectional view thru a multi-package module having wire bond z-interconnection between stacked flip-chip BGA (die up) and stacked die LGA semiconductor packages according to a further aspect of the invention, and in which an electrical shield is provided on the bottom package, and having a heat spreader affixed to an upper surface of the top package.
Figure 10E:
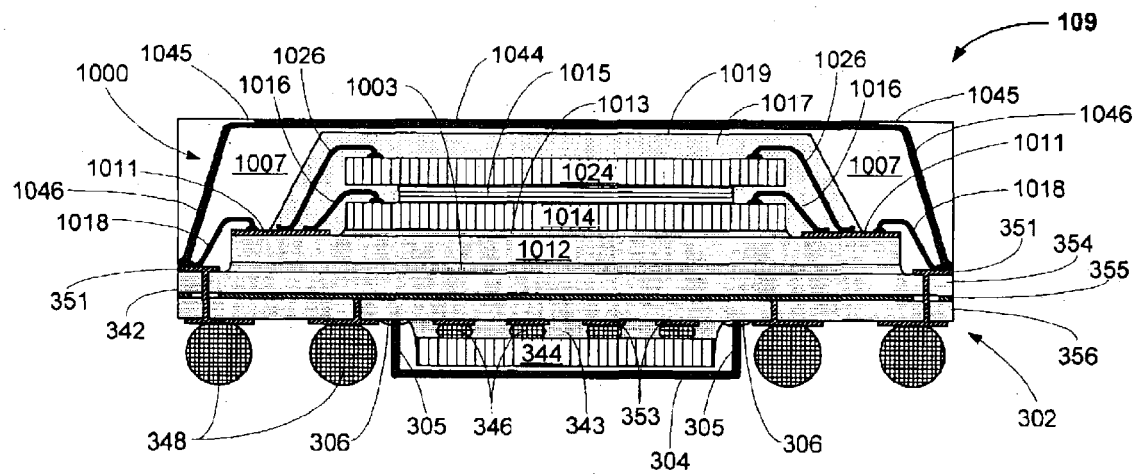
FIG. 10E is a diagrammatic sketch in a sectional view thru a multi-package module having wire bond z-interconnection between stacked flip-chip BGA (die up) and stacked die LGA semiconductor packages according to a further aspect of the invention, and in which an electrical shield is provided on the bottom package, and having a heat spreader according to another aspect of the invention.

By way of example, FIG. 10E is a diagrammatic sketch in a sectional view showing a MPM 109, including a stacked die top package stacked over a die-up flip chip bottom BGA, in which a "top" heat spreader is provided at the upper surface of the MPM. The construction of the top and bottom packages in MPM 109 is generally similar to that of MPM 105 in FIG. 10C, and like structures are identified in the FIGS. by like reference numerals. The top heat spreader in this example is formed of a thermally conductive material having a generally planar central portion 1044 situated over the top package 1000, and peripheral supporting members 1046 extending to the upper surface of the bottom package substrate 342. The upper surface of the planar portion 1044 is exposed to ambient at the MPM upper surface for efficient heat exchange away from the MPM. The top heat spreader may be formed, for example, of a sheet of metal (such as copper), for example by stamping. The supporting members 1046 can optionally be affixed to the upper surface of the bottom package substrate using an adhesive (not show in the FIGS.). The multi-package module structure is protected by formation of a module encapsulant 1007, and the heat spreader supporting members are embedded in the MPM encapsulant 1007 during the molding material curing process. In the embodiment of FIG. 10E a step like re-entrant feature 1045 is provided on the periphery of the planar upper portion 1044 of the heat spreader to allow for better mechanical integrity of the structure with less delamination from the molding compound. In this embodiment the space between the lower surface of the heat spreader 1044 and the upper surface 1019 of the LGA molding 1017 is filled by a thin layer of the MPM molding.

Alternatively, the top heat spreader can be a generally planar piece of a thermally conductive material such as, for example, a sheet of metal (such as copper), with no supporting members. At least the more central area of the upper surface of the planar heat spreader is exposed to ambient for efficient heat exchange away from the MPM. Such a simple planar heat spreader is shown in FIG. 10D at 1004, where the heat spreader is affixed to an upper surface of the top package molding. The construction of the stacked packages in MPM 1004 is generally similar to that of MPM 1044 in FIG. 10E, and like structures are identified in the FIGS. by like reference numerals. The top heat spreader 1004 in the example of FIG. 10D is a generally planar piece of a thermally conductive material having at least the more central area of its upper surface exposed to ambient for efficient heat exchange away from the MPM, as in the example of FIG. 10E. The top heat spreader may be, for example, a sheet of metal (such as copper). Here, however, the top heat spreader 1004 is affixed onto the upper surface 1019 of the upper package encapsulant 1017 using an adhesive 1006. The adhesive 1006 may be a thermally conductive adhesive, to provide improved heat dissipation. Usually the top heat spreader is affixed to the top package molding after the top package molding has been at least partly cured, but before the molding material is injected for the MPM encapsulation 1007. The periphery of the top heat spreader may be encapsulated with the MPM molding material. In the embodiment of FIG. 10D a step like re-entrant feature 1005 is provided on the periphery of the heat spreader 1004 to allow for better mechanical integrity of the structure with less delamination from the molding compound.

It is not necessary that a simple planar heat spreader, such as 1004 in FIG. 10D, be attached to the upper surface of the top package molding. Instead, the space between the lower surface of the simple planar heat spreader and the upper surface 1019 of the LGA molding 1017 can be filled by a thin layer of the MPM molding, and such a simple planar heat spreader may be affixed to the MPM encapsulant 1007 during the molding material curing process. The periphery of a simple planar top heat spreader can in such an embodiment be encapsulated with the MPM molding material, and may be provided with a step-like re-entrant feature on the periphery (refer to re-entrant feature 1005 in the simple planar heat spreader 1004 in FIG. 10D) to allow for better mechanical integrity of the structure with less delamination from the molding compound.

An advantage of a structure as in FIGS. 10D, 10E is improved thermal performance It is not necessary to have both a bottom package shield and a top heat spreader for all applications. Alternately one or the other may be adequate depending on the end product needs.

As will be appreciated from the foregoing, in all its various aspects the invention features wire bonding as the z-interconnect method between stacked packages. Generally, all LGAs stacked on a lower BGA must be smaller (in at least one dimension in the x-y plane) than the BGA to allow space at the periphery for the wire bonds. The wire diameter typically is of the order of 0.025 mm (0.050 to 0.010 mm range). The wire distance to the LGA substrate edge can differ in various embodiments, but is no less than a wire diameter. The relative sizes of BGA and LGA are determined primarily by the maximum die size in each. The die thickness and mold cap thickness primarily determine how many die can be stacked in one package.

Processes for making BGA packages and LGA packages for use in the invention are well established in the industry for both the wire bonded and the flip chip types of packages.

Testing of BGAs is well established in the industry, and typically is done by accessing contact to the solder ball pads. The LGAs can be tested in either of two ways, namely by accessing the LGA pads on the lower surface of the LGA of the substrate, similar to the pads of the solder balls in a BGA; or by accessing the z-interconnect pads on the upper surface of the substrate. The completed MPM assembly can be tested in the same as for testing BGAs.

The MPM assembly process is similar for the configurations according to the various aspects of the invention. Generally, the process includes steps of providing a first molded package including a first package substrate and at least one die attached to the first package substrate, dispensing adhesive onto an upper surface of the first molded package, placing a second molded package including a second package substrate and at least one die such that a lower surface of the second substrate contacts the adhesive on the upper surface of the first package, during the adhesive, and forming z-interconnects between the first and second substrate. Advantageously, the packages can be tested prior to assembly, and package is not meeting requirements for performance or reliability can be discarded, so that first packages and second package is tested as "good" are used in the assembled module.

Figure 11A:
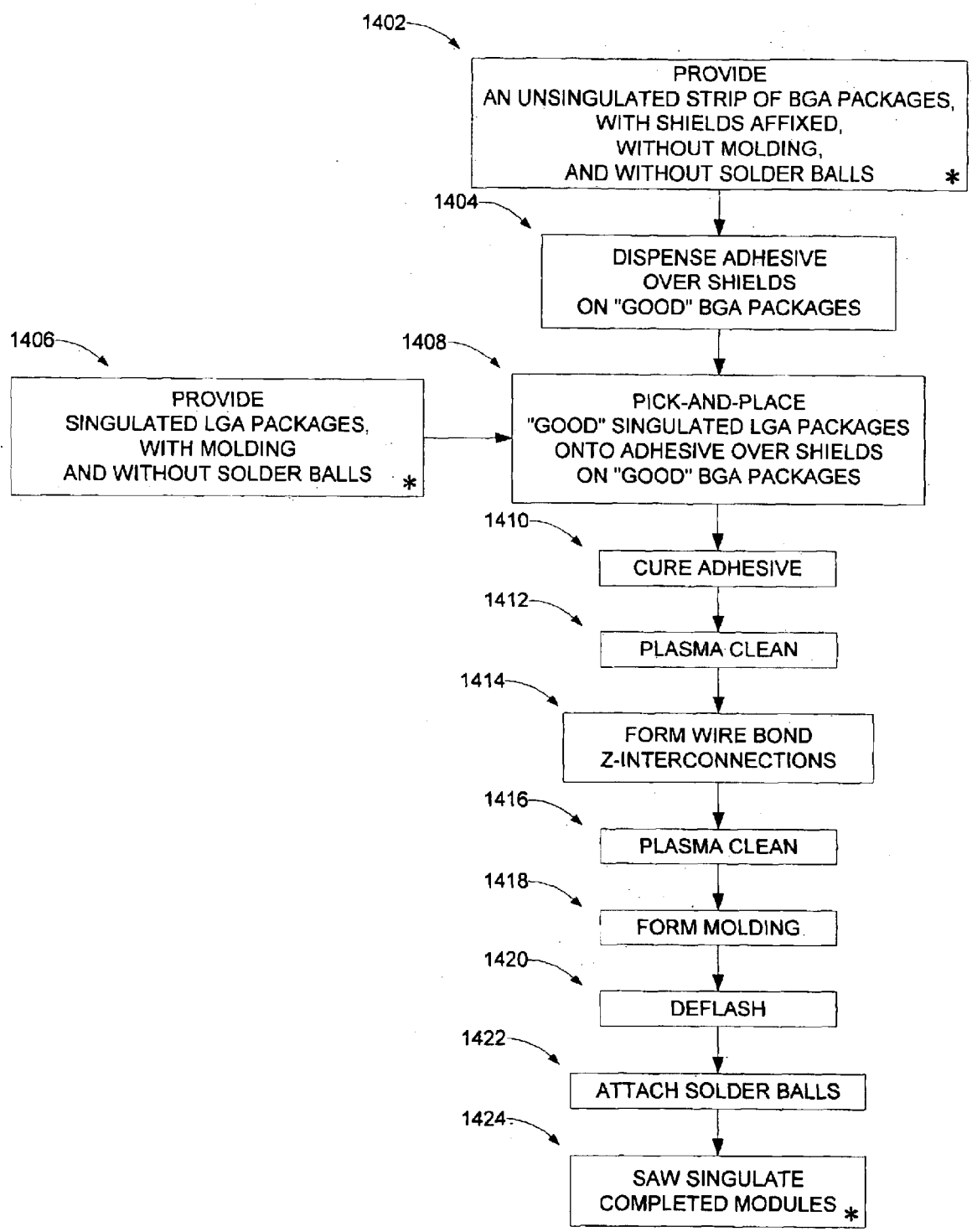
FIG. 11A is a flow diagram showing a process for assembly of a multi-package module as shown for example in FIG. 8A.

FIG. 11A is a flow diagram showing a process for assembly of a multi-package module as shown for example in FIG. 8A. In a step 1402, an unsingulated strip of ball grid array packages is provided. The BGA packages have shields affixed over the die. The shields protect the die and wire bond structures on the ball grid array packages, and accordingly no package molding is required. The BGA packages in the strip preferably are tested (as indicated in the FIG. by *) for performance and reliability before they are taken to subsequent steps in the process. Only packages identified as "good" are subjected to subsequent treatment. In a step 1404, adhesive is dispensed over the upper surface of the shields on "good" BGA packages. In a step 1406, singulated land grid array packages are provided. The singulated LGA packages are protected by a molding, and preferably are tested (*) and identified as "good". In a step 1408, a pick-and-place operation is carried out to place "good" LGA packages on the adhesive over the shields on the "good" BGA packages. In a step 1410, the adhesive is cured. In a step 1412, a plasma clean operation is performed in preparation for a step 1414 in which wire bond z-interconnections are formed between the stacked top LGA and bottom BGA packages. In a step 1416, an additional plasma clean may be performed, followed by the formation of the MPM molding in a step 1418. In a step 1420, a deflash operation may be carried out, to decompose and remove undesirable organic material. The deflash may be carried out by laser, or by chemical or plasma clean. In a step 1422, the second-level interconnect solder balls are attached to the underside of the module. In a step 1424, the completed modules are tested (*) and singulated from the strip, for example by saw singulation or by punch singulation, and packaged for further use.

Figure 11B:
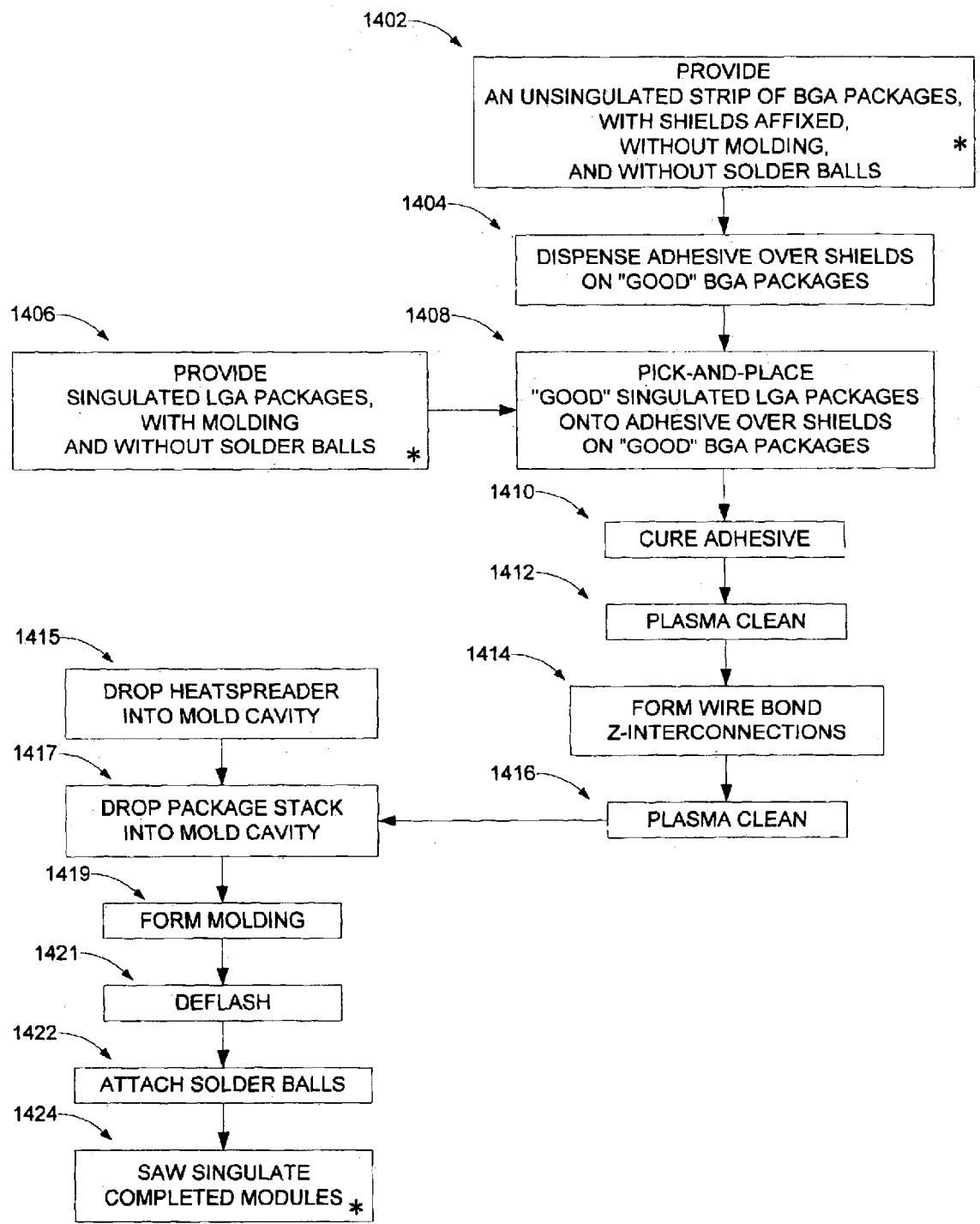
FIG. 11B is a flow diagram showing a process for assembly of a multi-package module as shown for example in FIG. 8B.

FIG. 11B is a flow diagram showing a process for assembly of a multi-package module as shown for example in FIG. 8B. This process is similar to the one shown in FIG. 11A, with additional steps interposed for installation of the heat spreader by a "drop-in" mold operation. Like steps in the process are identified by like reference numerals in the FIGS. In a step 1402, an unsingulated strip of ball grid array packages is provided. The BGA packages have shields affixed over the die. The shields protect the die and wire bond structures on the ball grid array packages, and accordingly no package molding is required. The BGA packages in the strip preferably are tested (as indicated in the FIG. by *) for performance and reliability before they are taken to subsequent steps in the process. Only packages identified as "good" are subjected to subsequent treatment. In a step 1404, adhesive is dispensed over the upper surface of the shields on "good" BGA packages. In a step 1406, singulated land grid array packages are provided. The singulated LGA packages are protected by a molding, and preferably are tested (*) and identified as "good". In a step 1408, a pick-and-place operation is carried out to place "good" LGA packages on the adhesive over the shields on the "good" BGA packages. In a step 1410, the adhesive is cured. In a step 1412, a plasma clean operation is performed in preparation for a step 1414 in which wire bond z-interconnections are formed between the stacked top LGA and bottom BGA packages. In a step 1416, an additional plasma clean may be performed. In a step 1415, a heat spreader is dropped into each mold cavity in a cavity molding apparatus. In a step 1417, a clean package stack from step 1416 is dropped into the mold cavity over the heat spreader. In a step 1419, an encapsulation material is injected into the mold cavity, and cured to form the MPM molding. In a step 1421, a deflash operation may be carried out, to decompose and remove undesirable organic material. The deflash may be carried out by laser, or by chemical or plasma clean. In a step 1422, the second-level interconnect solder balls are attached to the underside of the module. In a step 1424, the completed modules are tested (*) and singulated from the strip, for example by saw singulation or by punch singulation, and packaged for further use.

Figure 11C:
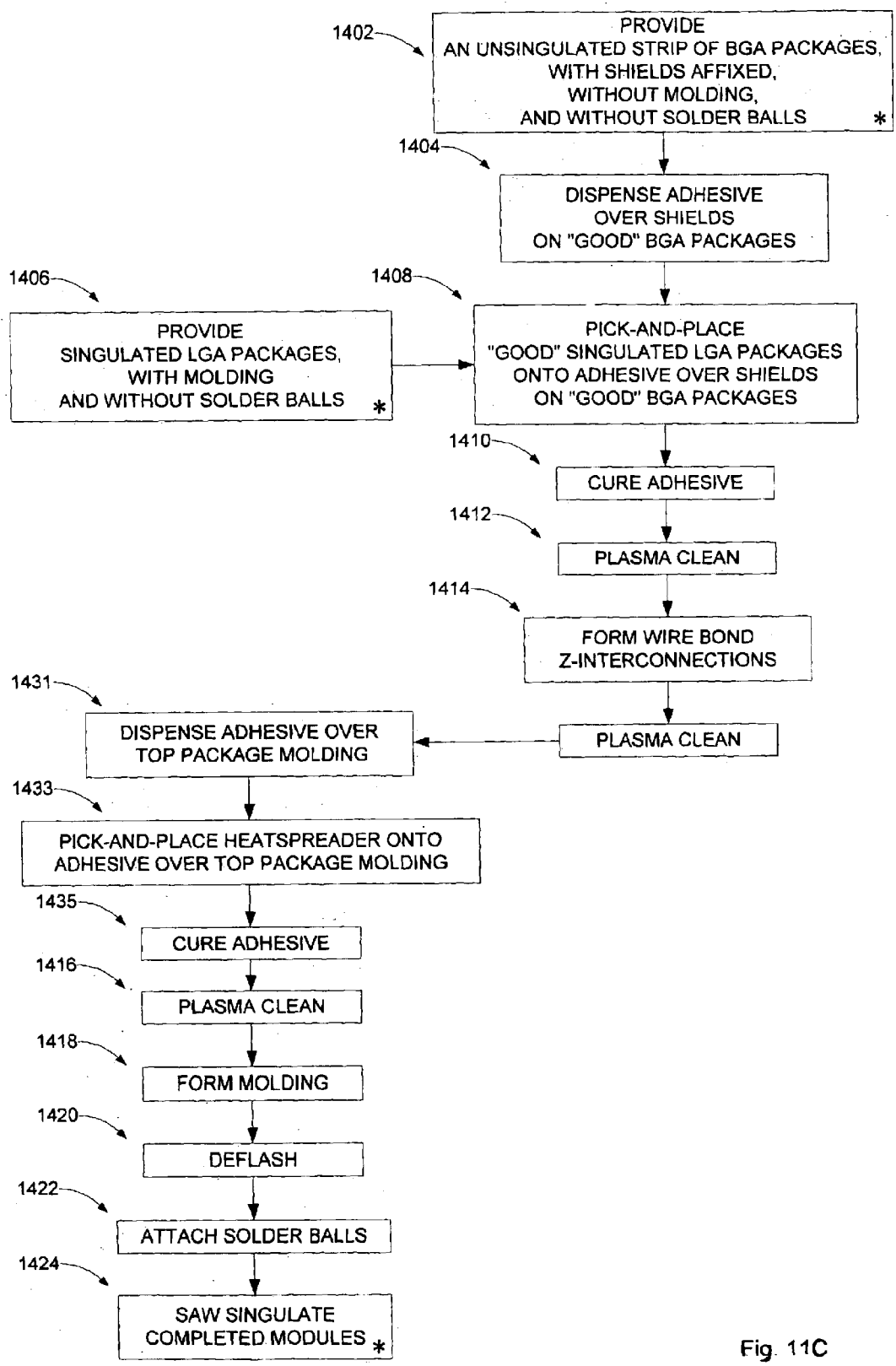
FIG. 11C is a flow diagram showing a process for assembly of a multi-package module as shown for example in FIG. 8C.

FIG. 11C is a flow diagram showing a process for assembly of a multi-package module as shown for example in FIG. 8C. This process is similar to the one shown in FIG. 11A, with additional steps interposed for installation of a planar heat spreader by attachment over the top package. Like steps in the process are identified by like reference numerals in the FIGS. In a step 1402, an unsingulated strip of ball grid array packages is provided. The BGA packages have shields affixed over the die. The shields protect the die and wire bond structures on the ball grid array packages, and accordingly no package molding is required. The BGA packages in the strip preferably are tested (as indicated in the FIG. by *) for performance and reliability before they are taken to subsequent steps in the process. Only packages identified as "good" are subjected to subsequent treatment. In a step 1404, adhesive is dispensed over the upper surface of the shields on "good" BGA packages. In a step 1406, singulated land grid array packages are provided. The singulated LGA packages are protected by a molding, and preferably are tested (*) and identified as "good". In a step 1408, a pick-and-place operation is carried out to place "good" LGA packages on the adhesive over the shields on the "good" BGA packages. In a step 1410, the adhesive is cured. In a step 1412, a plasma clean operation is performed in preparation for a step 1414 in which wire bond z-interconnections are formed between the stacked top LGA and bottom BGA packages, and then an additional plasma clean may be performed. In a step 1431, an adhesive is dispensed over the upper surface of the top LGA package molding, and in a step 1433, a pick-and-place operation is performed to place a planar heat spreader onto the adhesive of the top package molding. In a step 1435, the adhesive is cured. In a step 1416 and additional plasma clean is carried out, and in a step 1418, the MPM molding is formed. In a step 1420, a deflash operation may be carried out, to decompose and remove undesirable organic material. The deflash may be carried out by laser, or by chemical or plasma clean. In a step 1422, the second-level interconnect solder balls are attached to the underside of the module. In a step 1424, the completed modules are tested (*) and singulated from the strip, for example by saw singulation or by punch singulation, and packaged for further use.

Figure 12:
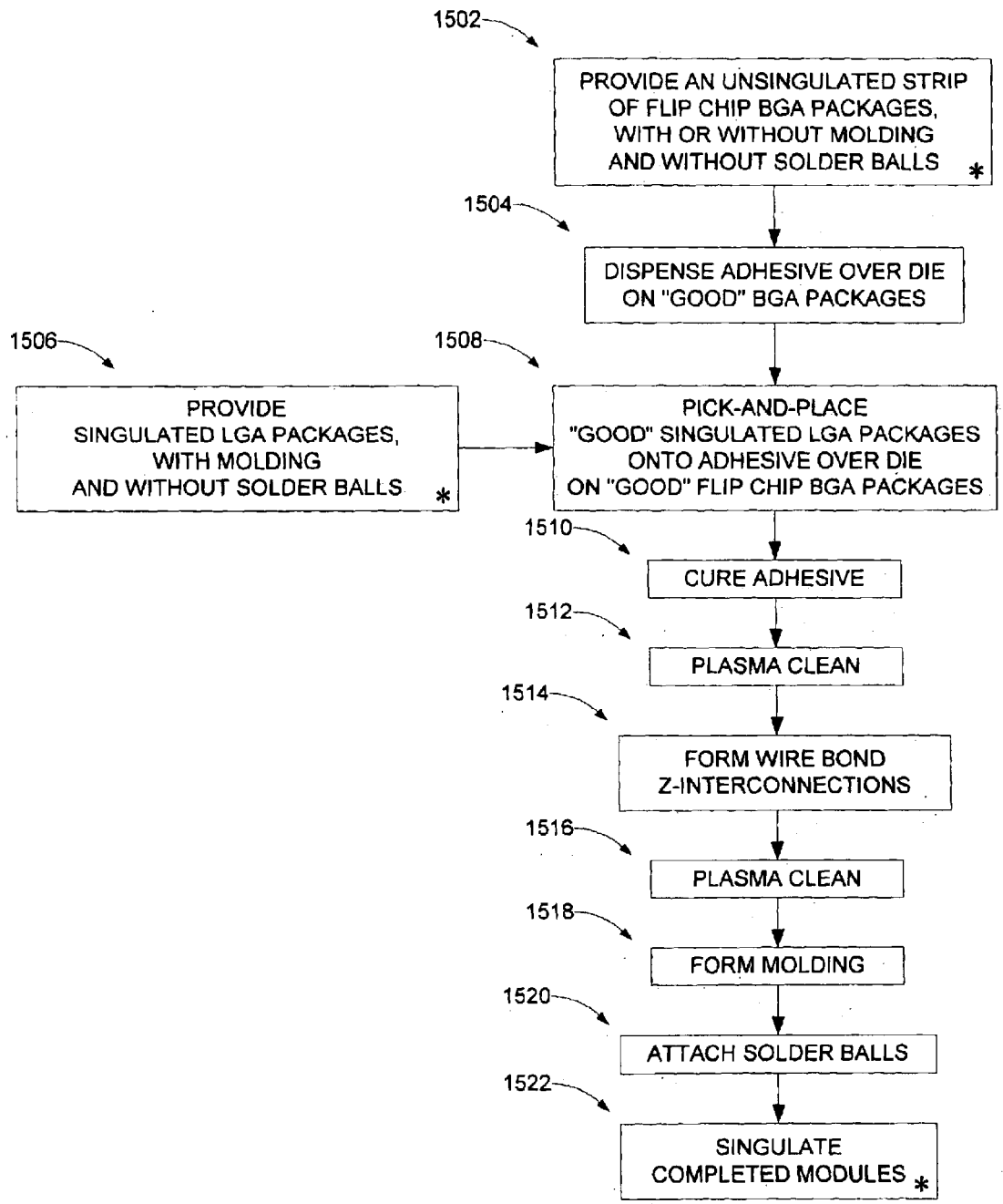
FIG. 12 is a flow diagram showing a process for assembly of a multi-package module as shown for example in FIG. 9A.

FIG. 12 is a flow diagram showing a process for assembly of a multi-package module as shown for example in FIG. 9A. In a step 1502, an unsingulated strip of die-down flip chip ball grid array bottom packages is provided. The BGA packages may or may not be provided with molding, and are provided without second-level interconnect solder balls. The BGA packages in the strip preferably are tested (as indicated in the FIG. by *) for performance and reliability before they are taken to subsequent steps in the process. Only packages identified as "good" are subjected to subsequent treatment. In a step 1504, adhesive is dispensed onto the upper surface (back side) of the die on "good" BGA packages. In a step 1506, singulated land grid array packages are provided. The singulated LGA packages are protected by a molding, and preferably are tested (*) and identified as "good". In a step 1508, a pick-and-place operation is carried out to place "good" LGA packages on the adhesive over the die on the "good" BGA packages. In a step 1510, the adhesive is cured. In a step 1512, a plasma clean operation is performed in preparation for a step 1514 in which wire bond z-interconnections are formed between the stacked top LGA and bottom BGA packages. In a step 1516, an additional plasma clean may be performed, followed by the formation of the MPM molding in a step 1518. In a step 1520, the second-level interconnect solder balls are attached to the underside of the module. In a step 1522, the completed modules are tested (*) and singulated from the strip, for example by saw singulation or by punch singulation, and packaged for further use.

Figure 13:
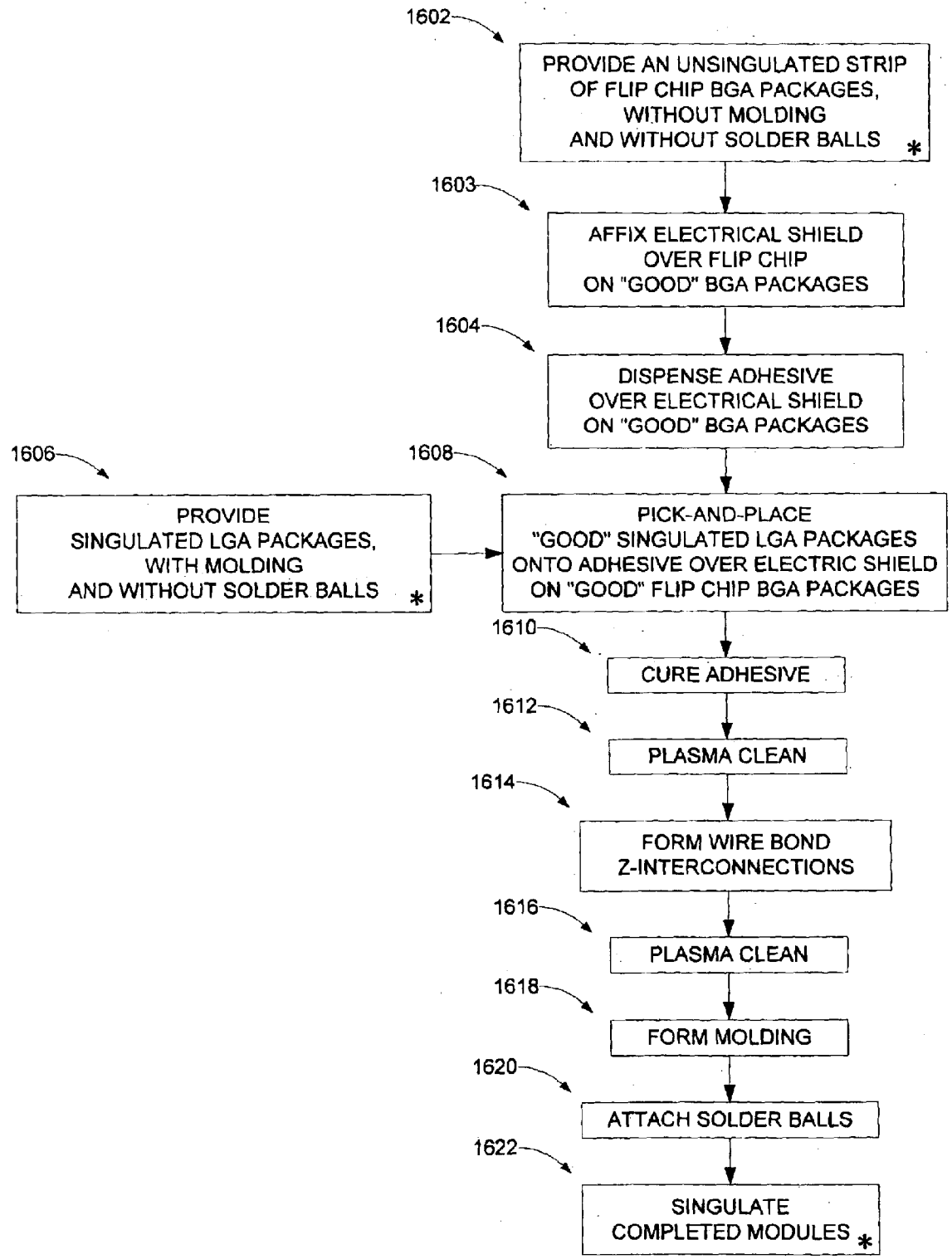
FIG. 13 is a flow diagram showing a process for assembly of a multi-package module as shown for example in FIG. 9B.
Figure 14:
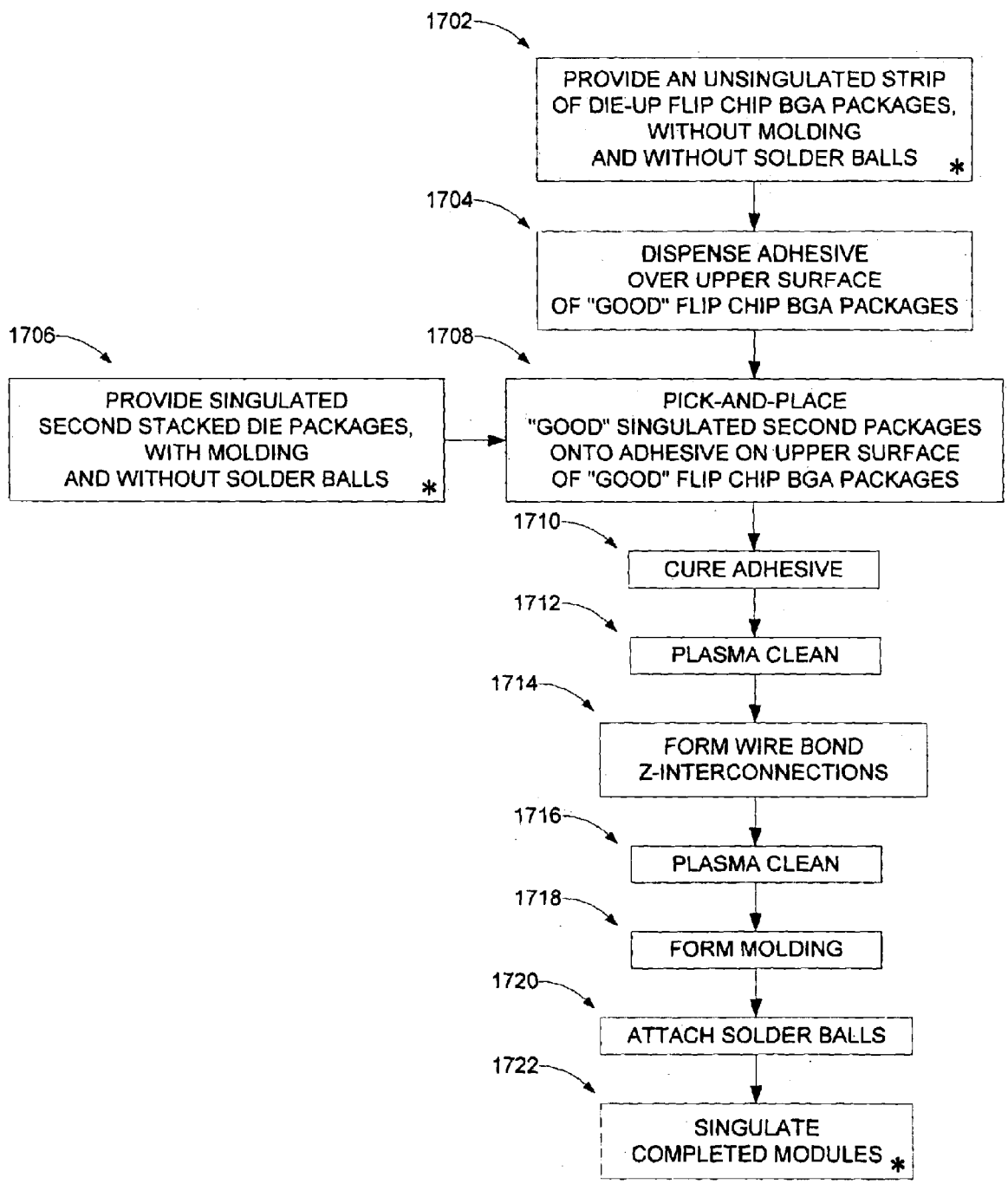
FIG. 14 is a flow diagram showing a process for assembly of a multi-package module as shown for example in FIG. 10A or FIG. 10B.

FIG. 13 is a flow diagram showing a process for assembly of a multi-package module as shown for example in FIG. 9B. This process is similar to the one shown in FIG. 12, with an additional step interposed for installation of the shield over the bottom package flip chip die. Like steps in the process are identified by like reference numerals in the FIGS. In a step 1602, an unsingulated strip of die-down flip chip ball grid array bottom packages is provided. The BGA packages may or may not be provided with molding, and are provided without second-level interconnect solder balls. The BGA packages in the strip preferably are tested (as indicated in the FIG. by *) for performance and reliability before they are taken to subsequent steps in the process. Only packages identified as "good" are subjected to subsequent treatment. In a step 1603, the electrical shield is affixed over the die on "good" bottom BGA packages. In a step 1604, adhesive is dispensed onto the upper surface of the shield on "good" BGA packages. In a step 1606, singulated land grid array packages are provided. The singulated LGA packages are protected by a molding, and preferably are tested (*) and identified as "good". In a step 1608, a pick-and-place operation is carried out to place "good" LGA packages on the adhesive over the shields on the "good" BGA packages. In a step 1610, the adhesive is cured. In a step 1612, a plasma clean operation is performed in preparation for a step 1614 in which wire bond z-interconnections are formed between the stacked top LGA and bottom BGA packages. In a step 1616, an additional plasma clean may be performed, followed by the formation of the MPM molding in a step 1618. In a step 1620, the second-level interconnect solder balls are attached to the underside of the module. In a step 1622, the completed modules are tested (*) and singulated from the strip, for example by saw singulation or by punch singulation, and packaged for further use.

As will be appreciated, individual ones of the various steps in the processes according to the invention can be carried out, according to the methods described herein, using substantially conventional techniques, with straightforward modification, as described herein, of conventional fabrication facilities. Such variation of conventional techniques and modification of conventional fabrication apparatus as may be required can be accomplished using the description herein without undue experimentation.

Other embodiments are within the following claims.

I claim:

1. A multi-package module, having a second package stacked over a first package, the stacked packages being electronically interconnected by wire bonds, wherein at least one said package is provided with an electrical shield.

2. The multi-package module of claim 1 wherein the first said package is provided with an electrical shield.

3. The multi-package module of claim 1 wherein the electrical shield is configured to serve as a heat spreader.

4. The multi-package module of claim 1 wherein the package that is provided with an electrical shield includes an RF die, and the shield serves to limit electromagnetic interference between the RF die and other die in the multi-package module.

5. The multi-package module of claim 1 wherein the first package is a flip-chip ball grid array package having a flip chip in a die-up configuration.

6. The multi-package module of claim 1 wherein the first package is a flip-chip ball grid array package having a flip chip in a die-down configuration.

7. The multi-package module of claim 1 where the second package is a stacked die package.

8. The multi-package module of claim 7 wherein adjacent stacked die in the stacked die package are separated by a spacer.

9. The multi-package module of claim 1, the first package comprising a first package substrate and the second package compriseing a second package substrate, wherein the firt package substrate includes an embedded ground plane.

10. The multi-package module of claim 9, the ground plane being configured to serve for heat dissipation.

11. The multi-package module of claim 9, the ground plane being configured to serve as an electrical shield.

12. A method for making a multi-package module including a second package stacked over a first package, comprising providing a first package having a shield, providing a second package, stacking the second package onto a generally planar upper surface of the shield, and electrically interconnecting the first and second packages by wire bonds.

13. The method of claim 12 wherein providing the first package comprises providing an unsingulated strip of packages.

14. The method of claim 12 wherein stacking the second package onto the upper surface of the shield comprises applying an adhesive onto an upper surface of the shield and placing the second package onto the adhesive.

15. The method of claim 14 wherein the adhesive is a curable adhesive, and further comprising curing the adhesive.

16. The method of claim 12 wherein providing the first package comprises testing packages for a performance and reliability requirement and selecting the first package as meeting the requirement.

17. The method of claim 12 wherein providing the second package comprises testing packages for a performance and reliability requirement and selecting the second package as meeting the requirement.

18. The method of claim 12, further comprising attaching second-level interconnect balls onto the first package substrate.

19. The method of claim 12, further comprising encapsulating the stacked packages in a multi-package module molding.

20. The method of claim 12 wherein providing the first package comprises providing a ball grid array package.

21. The method of claim 12, further comprising providing the multi-package module with a heat spreader.

22. The method of claim 21, wherein providing a heat spreader comprises carrying out a drop-in mold operation, the heat spreader being placed into a mold prior to forming a module molding.

23. The method of claim 21, wherein providing a heat spreader comprises affixing a generally planar portion of a heat spreader onto a generally planar upper surface of the second package.

24. The method of claim 12 wherein providing the first package comprises providing a flip chip ball grid array package.

25. The method of claim 12 wherein providing the first package having a shield comprises providing a die-down flip chip ball grid array package.

26. The method of claim 12 wherein providing the first package having a shield comprises providing a die-up flip chip ball grid array package.

27. The method of claim 25 wherein providing a die-down flip chip ball grid array package having a shield comprises providing a package having a shield including a generally planar part over the die.

28. The method of claim 26 wherein providing a die-up flip chip ball grid array package having a shield comprises providing a package having a shield including a generally planar part beneath the die.

29. A mobile device comprising a multi-package module having a second package stacked over a first package, the stacked packages being electronically interconnected by wire bonds, wherein at least one said package is provided with an electrical shield.

30. A computer comprising a multi-package module having a second package stacked over a first package, the stacked packages being electronically interconnected by wire bonds, wherein at least one said package is provided with an electrical shield.

* * * * *